(12) United States Patent
Aota et al.

(10) Patent No.: US 12,369,363 B2
(45) Date of Patent: Jul. 22, 2025

(54) SEMICONDUCTOR DEVICE

(71) Applicant: Kioxia Corporation, Tokyo (JP)

(72) Inventors: Shoji Aota, Mie (JP); Toshitaka Miyata, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 560 days.

(21) Appl. No.: 17/687,510

(22) Filed: Mar. 4, 2022

(65) Prior Publication Data

US 2023/0088980 A1      Mar. 23, 2023

(30) Foreign Application Priority Data

Sep. 21, 2021   (JP) .................... 2021-152926

(51) Int. Cl.
| | |
|---|---|
| H10D 62/10 | (2025.01) |
| G11C 16/08 | (2006.01) |
| H10B 43/10 | (2023.01) |
| H10B 43/35 | (2023.01) |
| H10B 43/40 | (2023.01) |
| H10D 64/01 | (2025.01) |
| H10D 64/27 | (2025.01) |
| H10D 64/66 | (2025.01) |

(52) U.S. Cl.
CPC .......... *H10D 62/102* (2025.01); *H10B 43/10* (2023.02); *H10B 43/35* (2023.02); *H10B 43/40* (2023.02); *H10D 64/512* (2025.01); *G11C 16/08* (2013.01); *H10D 64/01* (2025.01); *H10D 64/664* (2025.01)

(58) Field of Classification Search
CPC .......... H01L 29/0607; H01L 29/42356; H01L 29/401; H01L 29/4941; H10B 43/35; H10B 43/40; H10B 43/10; G11C 16/08; H10D 62/102; H10D 64/512; H10D 64/01; H10D 64/664

See application file for complete search history.

(56) References Cited

U.S. PATENT DOCUMENTS

| | | |
|---|---|---|
| 2003/0098509 A1 | 5/2003 | Kamiya et al. |
| 2006/0202285 A1 | 9/2006 | Kamiya et al. |

(Continued)

FOREIGN PATENT DOCUMENTS

| | | |
|---|---|---|
| JP | 2020-27865 A | 8/2018 |
| JP | 2020-027865 A | 2/2020 |

(Continued)

*Primary Examiner* — Richard A Booth
(74) *Attorney, Agent, or Firm* — Foley & Lardner LLP

(57) ABSTRACT

A semiconductor device includes a first region that contains a first conductive type impurity and is provided on a substrate, a second region that is provided in the first region and contains the first conductive type impurity at a higher concentration than the first region, a first structure that is provided on the substrate on one side of the second region in a first direction along the substrate and has a first sidewall at least on the second region side, a second structure that is provided on the substrate on the other side of the second region in the first direction and has a second sidewall at least on the second region side, and a contact that passes between the first and second sidewalls facing each other across the second region, extends to the second region, and is electrically connected to the second region.

13 Claims, 19 Drawing Sheets

(56) References Cited

U.S. PATENT DOCUMENTS

| | | | |
|---|---|---|---|
| 2013/0277749 A1* | 10/2013 | Kura | ............... H10B 12/31 |
| | | | 438/275 |
| 2015/0295081 A1 | 10/2015 | Matsuda | |
| 2018/0019343 A1 | 1/2018 | Asami | |
| 2018/0122930 A1* | 5/2018 | Okamoto | ............ H01L 27/0886 |
| 2020/0051908 A1 | 2/2020 | Matsuura | |
| 2021/0257446 A1 | 8/2021 | Miyata | |

FOREIGN PATENT DOCUMENTS

| | | |
|---|---|---|
| TW | 201423998 A | 6/2014 |
| TW | 202133440 A | 9/2021 |

\* cited by examiner

SEMICONDUCTOR DEVICE

CROSS-REFERENCE TO RELATED APPLICATION

This application is based upon and claims the benefit of priority from Japanese Patent Application No. 2021-152926, filed Sep. 21, 2021, the entire contents of which are incorporated herein by reference.

FIELD

Embodiments described herein relate generally to a semiconductor device.

BACKGROUND

A semiconductor device including a CMOS transistor or the like includes, for example, a diffusion region in which impurities are diffused, a gate electrode provided on the diffusion region, and a contact electrically connected to the diffusion region. In order to reduce the contact resistance between the contact and the diffusion region, a region in which impurities are diffused at a high concentration may be further provided in the diffusion region in which the contact contacts. However, in order to maintain the breakdown voltage of the semiconductor device, if an attempt is made to reliably fit the high-concentration diffusion region in the low-concentration diffusion region, the size of the semiconductor device may become large.

DETAILED DESCRIPTION

At least one embodiment provides a semiconductor device capable of improving the alignment accuracy of a high-concentration diffusion region with respect to a low-concentration diffusion region.

In general, according to at least one embodiment, the semiconductor device includes a first region that contains a first conductive type impurity and is provided on a substrate, a second region that is provided in the first region and contains the first conductive type impurity at a higher concentration than the first region, a first structure that is provided on the substrate on one side of the second region in a first direction along the substrate and has a first sidewall at least on the second region side, a second structure that is provided on the substrate on the other side of the second region in the first direction and has a second sidewall at least on the second region side, and a contact that passes between the first and second sidewalls facing each other across the second region, extends to the second region, and is electrically connected to the second region.

The present disclosure will be described in detail below with reference to the drawings. The present disclosure is not limited to the following embodiments. In addition, the components in the following embodiments include those that can be easily assumed by those skilled in the art or those that are substantially the same.

First Embodiment

Hereinafter, a first embodiment will be described in detail with reference to the drawings.

(Configuration of Semiconductor Device)

Figure 1A:
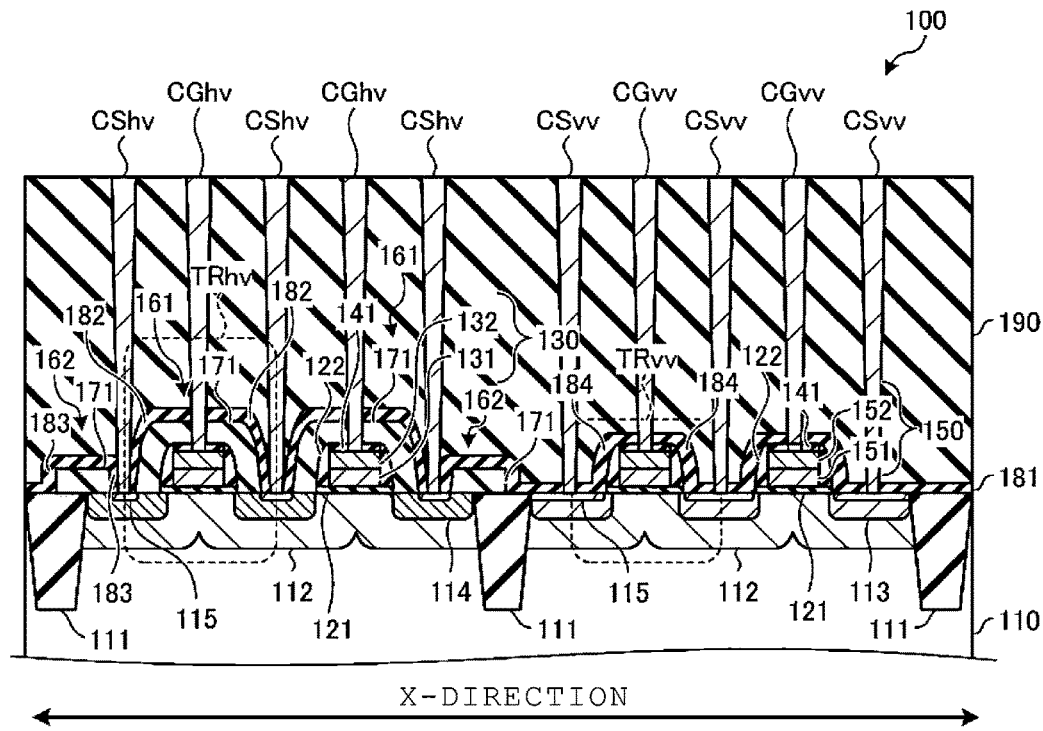
FIGS. 1A and 1B are diagrams showing an example of a configuration of a semiconductor device according to a first embodiment.
Figure 1B:
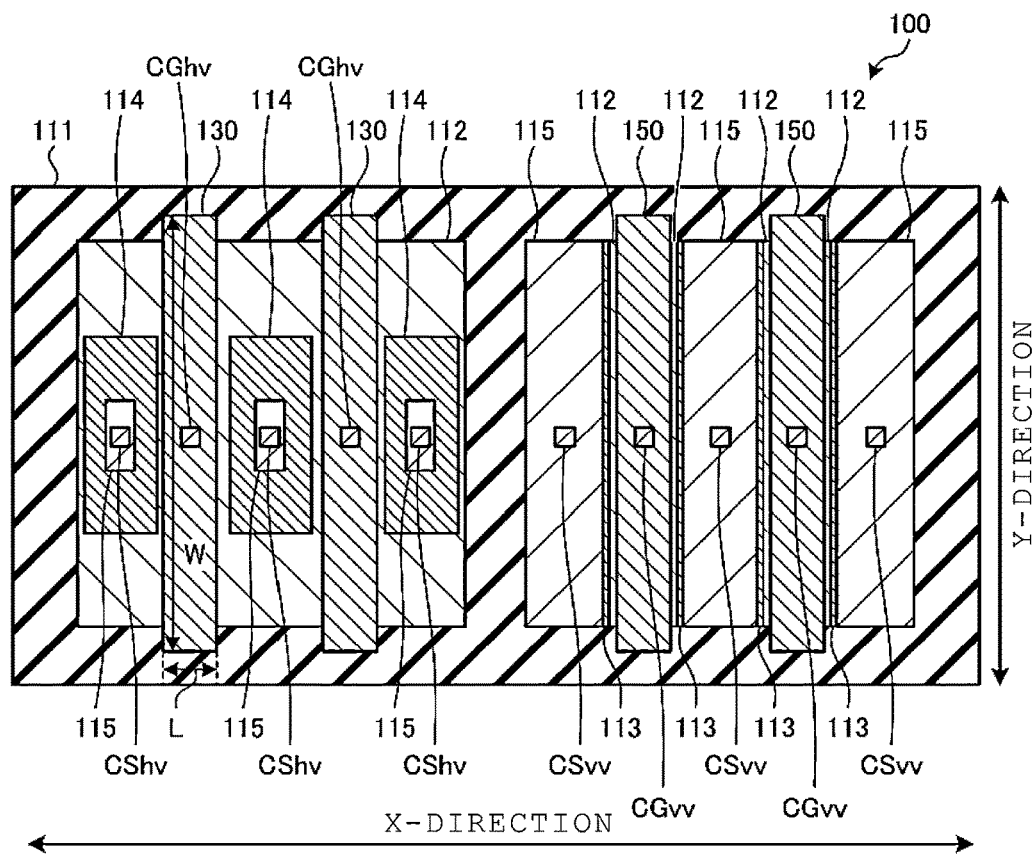

FIGS. 1A and 10B are diagrams showing an example of a configuration of a semiconductor device 100 according to the first embodiment. FIG. 1A is a cross-sectional view of the semiconductor device 100 along an X direction and FIG. 1B is a schematic top view showing a layout of the semiconductor device 100. In FIG. 1B, an element isolation layer 111, diffusion regions 112, 113, and 114, a silicide layer 115, and gate electrodes 130 and 150 are mainly shown, and other configurations are omitted.

In the present specification, the surface of the substrate 110 on which the transistor TRhv, which will be described later, is formed is the upper surface, and the direction in which the gate electrodes 130 of the transistor TRhv are stacked is the upper side of the semiconductor device 100.

Further, in the present specification, both the X direction and a Y direction are directions along the direction of the upper surface of the substrate 110, and the X direction and the Y direction are orthogonal to each other. Further, in the first embodiment, a gate length L direction of a gate electrode 130, which will be described later, may be referred to as a first direction and the first direction is a direction along the X direction. Further, the direction that is a gate width W direction of the gate electrode 130 and intersects the first direction may be referred to as a second direction, and the second direction is a direction along the Y direction. However, since the semiconductor device 100 may include manufacturing errors, the first direction and the second direction are not necessarily orthogonal to each other.

As shown in FIGS. 1A and 1B, the semiconductor device 100 includes the substrate 110, transistors TRhv and TRvv, an interlayer insulating layer 190, and contacts CShv, CGhv, CSvv, and CGvv.

The transistor TRhv includes a diffusion region 112, a gate insulating layer 121, a gate electrode 130, a block layer 171, and a liner layer 181. The transistor TRhv may include a diffusion region 114 and a silicide layer 115. The transistor TRvv includes a diffusion region 112, a gate insulating layer 121, a gate electrode 150, and a liner layer 181. The transistor TRvv may include a diffusion region 113 and a silicide layer 115.

The substrate 110 is a semiconductor substrate such as a silicon substrate. The substrate 110 is provided with the element isolation layer 111 that electrically separates the formation regions of the transistors TRhv and TRvv.

Further, diffusion regions 112 and 114 and the silicide layer 115 are provided in the region of the substrate 110 separated by the element isolation layer 111 and on which the transistor TRhv is formed. Further, diffusion regions 112 and 113 and the silicide layer 115 are provided in the region of the substrate 110 separated by the element isolation layer 111 and on which the transistor TRvv is formed.

The diffusion region 112 as a first region is a region in which predetermined conductive type impurities of P-type or N-type are diffused to the substrate 110 at a predetermined concentration and includes the upper surface of the substrate 110. The diffusion region 112 extends over substantially the entire region separated by the element isolation layer 111.

The diffusion region 114 as a second region is a region provided in the diffusion region 112 and including the upper surface of the substrate 110 and in which the same conductive type impurities as the diffusion region 112 are diffused to the substrate 110 at a high concentration as compared with the diffusion region 112. A plurality of diffusion regions 114 are provided in the diffusion region 112. A predetermined distance is allocated between each diffusion region 114 and the element isolation layer 111 in the X direction and the Y direction.

The diffusion region 113 is a region provided in the diffusion region 112 and including the upper surface of the substrate 110 and in which the same conductive type impurities as the diffusion regions 112 and 114 are diffused to the substrate 110 at a higher concentration than the diffusion region 112 and a lower concentration than the diffusion region 114. A plurality of diffusion regions 113 are provided in the diffusion region 112. These diffusion regions 113 cover substantially the entire surface of the diffusion region 112, except for the area directly under the gate electrode 150, which will be described later.

Therefore, the end portion of each diffusion region 113 in the Y direction may be in contact with the element isolation layer 111. Further, among the plurality of diffusion regions 113, the diffusion region 113 provided at the end portion in the X direction may be in contact with the element isolation layer 111 on the X-direction side. Therefore, the width of each diffusion region 113 in the X direction may be larger than that of the above-mentioned diffusion region 114 in the X direction.

The silicide layer 115 includes the upper surface of the substrate 110 provided with the diffusion regions 113 and 114. The silicide layer 115 is, for example, a tungsten silicide layer, a nickel silicide layer, a nickel platinum silicide layer, or the like.

Here, the center position of the silicide layer 115 in the direction along the X direction substantially coincides with the respective center positions of the diffusion regions 114 in the direction along the X direction. Such a relationship between the silicide layer 115 and the diffusion region 114 is also established in the Y direction. That is, the center position of the silicide layer 115 in the direction along the Y direction substantially coincides with the respective center positions of the diffusion regions 114 in the direction along the Y direction.

As a result, the silicide layer 115 fits in the diffusion region 114 without deviating from the diffusion region 114 and is surrounded by the diffusion region 114 having a predetermined width.

On the other hand, the silicide layer 115 covers substantially the entire surface of the diffusion region 113, except for the vicinity of the gate electrode 150, which will be described later. At this time, the center position of the silicide layer 115 in the direction along the X direction does not have to coincide with the respective center positions of the diffusion regions 113 in the direction along the X direction.

Further, the Y-direction end portion of each silicide layer 115 may be in contact with the element isolation layer 111. Further, among the plurality of silicide layers 115, the silicide layer 115 provided at the end portion in the X direction may be in contact with the element isolation layer 111 on the X-direction side.

As a result, the width of the silicide layer 115 provided in the diffusion region 113 in the X direction may be larger than that of the silicide layer 115 provided in the diffusion region 114 in the X direction.

On the diffusion region 112 of the substrate 110, in the region between the plurality of diffusion regions 114 located in the X direction, a gate insulating layer 121 extending in the direction along the Y direction, a gate electrode 130, and a cap layer 141 are stacked in this order. The gate insulating layer 121, the gate electrode 130, and the cap layer 141 project onto the element isolation layer 111 in the Y direction.

The gate insulating layer 121 is, for example, a silicon oxide layer, a hafnium oxide layer, a zirconium oxide layer, or the like. The cap layer 141 is an insulating layer such as a silicon nitride layer.

The gate electrode 130 has a polymetal gate structure including, for example, a polysilicon electrode 131 and a metal electrode 132 provided on the polysilicon electrode 131. That is, the polysilicon electrode 131 is, for example, a conductive polysilicon layer or the like, and functions as a polygate. The metal electrode 132 is, for example, a tungsten silicide layer or the like, and functions as a metal gate.

Here, the length of the gate electrode 130 in the direction along the Y direction, which is a stretching direction of the gate electrode 130, is the gate width W. Further, the length of the gate electrode 130 in the direction along the X direction intersecting the stretching direction of the gate electrode 130 is the gate length L.

A spacer layer 122 is provided on the side surface of the gate electrode 130 and the cap layer 141. The spacer layer 122 is an insulating layer such as a silicon oxide layer.

The block layer 171 is provided in the region of the substrate 110 separated by the element isolation layer 111 and provided with the diffusion regions 112 and 114. The block layer 171 is an insulating layer such as a silicon oxide layer, a silicon nitride layer, or a silicon oxynitride layer.

The block layer 171 covers the diffusion region 112 excluding the portion where the diffusion region 114 is provided, and also covers substantially the whole of the gate insulating layer 121, the gate electrode 130, the cap layer 141, and the spacer layer 122. The block layer 171 may also cover a part of the element isolation layer 111. With such a configuration, block layers 171 are formed on both sides of the gate electrode 130 in the X direction via the spacer layers 122.

Here, in the gate electrodes 130 adjacent to each other in the X direction, the center position between the block layers 171 facing each other on the side surfaces of the gate electrodes 130 in the direction along the X direction and the center position of the diffusion region 114 provided between the gate electrodes 130 in the direction along the X direction substantially coincide with each other. Therefore, the center position between the block layers 171 in the direction along the X direction and the center position of the silicide layer 115 provided in the diffusion region 114 in the direction along the X direction substantially coincide with each other.

Further, the center position of the diffusion region 114 in the direction along the X direction between the block layer 171 provided on the side opposite to the gate electrode 130 at the end portion in the X direction and the block layer 171 provided on the side surface of the gate electrode 130 on the side facing the block layer 171 substantially coincides with the center position of the diffusion region 114 in the direction along the X direction. Therefore, the center position between the block layers 171 in the direction along the X direction and the center position of the silicide layer 115 provided in the diffusion region 114 in the direction along the X direction also substantially coincide with each other.

As a result, a predetermined distance is allocated in the X direction between the gate electrodes 130 located side by side to the respective diffusion regions 114 in the X direction and the diffusion regions 114.

The relationship between the block layer 171 and the diffusion region 114 and the silicide layer 115 as described above is also established in the Y direction. That is, the center position in the direction along the Y direction between the block layers 171 facing to each other in the Y direction across the diffusion region 114 substantially coincides with the center position of the diffusion region 114 in the direction along the Y direction, and the center position of the silicide layer 115 in the direction along the Y direction.

The liner layer 181, for example, such as a silicon nitride layer is provided on the block layer 171. The liner layer 181 covers substantially the whole of the diffusion regions 112 and 114 excluding the connection portion of the contact CShv, the gate insulating layer 121, the upper surfaces of the gate electrode 130 and the cap layer 141 excluding the connection portion of the contact CGhv, and the spacer layer 122 via the block layer 171.

The liner layer 181 also covers the side surface on the diffusion region 114 side of the block layer 171 provided on the side opposite to the gate electrode 130 across the diffusion region 114 in the X direction and the side surface on the element isolation layer 111. Further, as will be described later, the liner layer 181 also covers the region of the substrate 110 provided with the diffusion regions 112 and 113.

With such a configuration, sidewalls 182 as first sidewalls by the liner layer 181 are located on both sides of the gate electrode 130 in the X direction via the spacer layer 122 and the block layer 171.

The structure including the gate insulating layer 121, the gate electrode 130, the cap layer 141, the spacer layer 122, and the block layers 171 and the sidewalls 182 on both sides of the gate electrode 130 in the X direction may be referred to as a stacked body 161 as a first structure.

Further, the sidewalls 183 as second sidewalls are located on both sides of the block layer 171 in the X direction by the liner layer 181 covering the side surface on the diffusion region 114 side of the block layer 171 provided on the side opposite to the gate electrode 130 across the diffusion region 114 in the X direction and the side surface on the element isolation layer 111.

The structure including the block layer 171 not including the gate electrode 130 and the sidewalls 183 on both sides of the block layer 171 in the X direction may be referred to as a stacked body 162 as a second structure.

The interlayer insulating layer 190 such as a silicon oxide layer is provided on the liner layer 181. The interlayer insulating layer 190 covers substantially the whole of the diffusion regions 112 and 114, the gate insulating layer 121, the gate electrode 130, the cap layer 141, and the spacer layer 122 via the block layer 171 and the liner layer 181. Further, as will be described later, the interlayer insulating layer 190 also extends to the region where the diffusion regions 112 and 113 are provided, and covers the entire upper surface of the substrate 110, for example.

The contact CGhv as a second contact that penetrates the interlayer insulating layer 190, the liner layer 181, the block layer 171, and the cap layer 141 and applies a gate voltage to the gate electrode 130 is connected to the upper surface of the gate electrode 130 of the transistor TRhv.

The contact CShv as a first contact that penetrates the interlayer insulating layer 190, the liner layer 181, and the block layer 171 and applies a high voltage to the source and drain of the transistor TRhv is connected to the silicide layer 115 provided on the diffusion regions 114 on both sides of the gate electrode 130 in the X direction. The contact CShv is shared between the transistors TRhv adjacent to each other in the X direction.

These contacts CGhv and CShv contain a metal such as tungsten as a main component.

As described above, the transistor TRhv provided in the vicinity of the diffusion region 114 containing high-concentration impurities and to which a high voltage is applied is configured as, for example, a high voltage (HV) metal oxide semiconductor (MOS) transistor. Such a transistor TRhv is also referred to as a high breakdown voltage MOS transistor.

Here, the contact CShv between the transistors TRhv adjacent to each other in the X direction passes between the sidewalls 182 of the respective transistors TRhv located on both sides in the X direction and is connected to the silicide layer 115. At this time, the contact CShv between the transistors TRhv is in contact with at least one of the sidewalls 182 on both sides in the X direction on the side surface. In the example of FIG. 1A, the contact CShv is in contact with both sidewalls 182 on both sides in the X direction.

In other words, the thicknesses of the block layer 171 and the liner layer 181 are preferably adjusted so that the gaps between the sidewalls 182 of the respective gate electrodes 130 located on both sides in the X direction are, for example, about the same as the diameter of the contact CShv.

Further, among the plurality of transistors TRhv located in the X direction, on one side of the transistor TRhv located at the end portion in the X direction, the contact CShv passes between the sidewall 182 of the transistor TRhv located on one side in the X direction and the sidewall 183 of the block layer 171 located on the other side in the X direction and is connected to the silicide layer 115.

At this time, in the transistor TRhv at the end portion in the X direction, the contact CShv is in contact with at least one of the sidewalls 182 and 183 on both sides in the X direction on the side surface. In the example of FIG. 1A, the contact CShv is in contact with both sidewalls 182 and 183.

In other words, the thicknesses of the block layer 171 and the liner layer 181 are preferably adjusted so that the gap between each gate electrode 130 located on both sides in the X direction and the sidewalls 182 and 183 of the block layer 171 that does not include the gate electrode 130 is, for example, about the same as the diameter of the contact CShv.

As described above, the diffusion region 114 and the silicide layer 115 to which a high voltage is applied by the contact CShv maintain a predetermined distance from the element isolation layer 111 in the X direction and the Y direction. Further, the silicide layer 115 is surrounded by the diffusion region 114 having a predetermined width. As a result, the breakdown voltage of the transistor TRhv is maintained.

On the diffusion region 112 of the substrate 110, in the region between the plurality of diffusion regions 113 located in the X direction, the gate insulating layer 121 extending in the direction along the Y direction, the gate electrode 150, and the cap layer 141 are stacked in this order. The gate insulating layer 121, the gate electrode 150, and the cap layer 141 project onto the element isolation layer 111 in the Y direction. The spacer layer 122 is provided on the side surface of the gate electrode 150 and the cap layer 141.

The gate electrode 150 has the same configuration as the gate electrode 130, for example. That is, the gate electrode 150 is configured as a polymetal gate including, for example, a polysilicon electrode 151 and a metal electrode 152 provided on the polysilicon electrode 151.

Further, as described above, the liner layer 181 covers the region of the substrate 110 provided with the diffusion regions 112 and 113. In the region where the diffusion regions 112 and 113 are provided, the liner layer 181 covers substantially the whole of the diffusion regions 112 and 113 excluding the connection portion of the contact CSvv, the gate insulating layer 121, the upper surfaces of the gate electrode 150 and the cap layer 141, and the spacer layer 122.

With such a configuration, sidewalls 184 by the liner layer 181 are located on both sides of the gate electrode 150 in the X direction via the spacer layer 122.

Further, as described above, the interlayer insulating layer 190 covers the entire upper surface of the substrate 110, for example. In the region where the diffusion regions 112 and 113 are provided, the interlayer insulating layer 190 covers substantially the whole of the diffusion regions 112 and 113, the gate insulating layer 121, the gate electrode 150, the cap layer 141, and the spacer layer 122 via the liner layer 181.

The contact CGvv that penetrates the interlayer insulating layer 190, the liner layer 181, and the cap layer 141 and applies a gate voltage to the gate electrode 150 is connected to the upper surface of the gate electrode 150 of the transistor TRvv.

The contact CSvv that penetrates the interlayer insulating layer 190 and the liner layer 181 and applies a voltage to the source and drain of the transistor TRvv is connected to the silicide layer 115 provided on the diffusion regions 113 on both sides of the gate electrode 150 in the X direction. The contact CSvv is shared between the transistors TRvv adjacent to each other in the X direction.

These contacts CGvv and CSvv contain a metal such as tungsten as a main component, as in the case of the above-mentioned contact CGhv and CShv.

As described above, the transistor TRvv provided in the vicinity of the diffusion region 113 containing impurities having a concentration lower than that of the diffusion region 114 and to which a relatively low voltage is applied is configured, for example, as a low voltage (LV: Low Voltage, and VLV: Very Low Voltage) MOS transistor.

The contact CSvv between the transistors TRvv adjacent to each other in the X direction passes between the sidewalls 184 of the respective transistors TRvv located on both sides in the X direction and is connected to the silicide layer 115.

Further, among the plurality of transistors TRvv located in the X direction, on one side of the transistor TRvv located at the end portion in the X direction, the contact CSvv passes near the sidewall 184 of the transistor TRvv located on one side in the X direction and is connected to the silicide layer 115.

Here, each of the width of the diffusion region 113 and the width of the silicide layer 115 provided in the diffusion region 113 in the X direction is larger than each of the width of the diffusion region 114 and the width of the silicide layer 115 provided in the diffusion region 114 in the X direction, for example. Further, the sidewall 184 on the side surface of the gate electrode 150 is provided on the side surface of the spacer layer 122 without passing through the block layer 171.

Therefore, a wider space is allocated between the sidewall 184 of each transistor TRvv and the contact CSvv as compared with the case of the above-mentioned transistor TRhv. Therefore, these contacts CSvv are connected to the silicide layer 115 in a state where the side surfaces are not in contact with any of the sidewalls 184, for example.

Further, as described above, the diffusion region 113 and the silicide layer 115 are in contact with the element isolation layer 111, for example, in the X direction. However, since the voltage applied to the diffusion region 113 and the silicide layer 115 by the contact CSvv is relatively low, the breakdown voltage of the transistor TRvv is sufficiently maintained.

(Method for Manufacturing Semiconductor Device)

Next, the method for manufacturing the semiconductor device 100 of the first embodiment will be described with reference to FIGS. 2A to 7. FIGS. 2A to 6 are diagrams illustrating a part of the procedure of the method for manufacturing the semiconductor device 100 according to the first embodiment in order. More specifically, FIGS. 2A to 6 show a cross section of the semiconductor device 100 along the X direction in the manufacturing process.

Figure 2A:
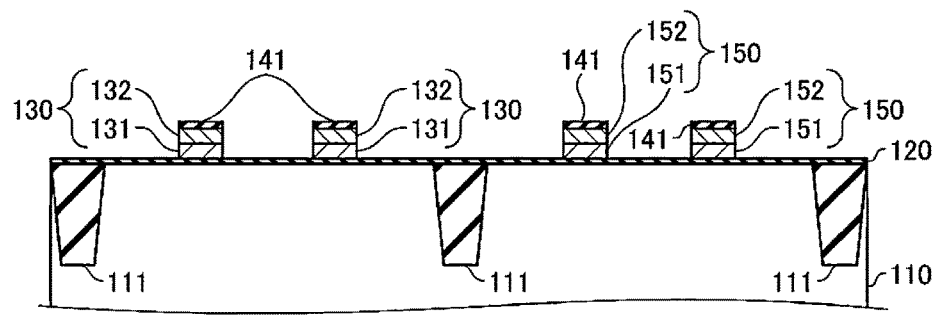
FIGS. 2A to 2D are diagrams illustrating a part of a procedure of a method for manufacturing the semiconductor device according to the first embodiment in order.

As shown in FIG. 2A, the element isolation layer 111 is formed on the substrate 110 such as a silicon substrate. The element isolation layer 111 is formed by forming a groove surrounding, for example, a region of the substrate 110 where the transistors TRhv and TRvv are formed, and filling the groove with an insulating layer such as a silicon oxide layer. Further, a gate insulating layer 120 is formed on the entire upper surface of the substrate 110.

Further, the gate electrodes 130 and 150 and the cap layer 141 are formed on the gate insulating layer 120 in the region surrounded by the element isolation layer 111. For the gate electrodes 130 and 150 and the cap layer 141, for example, a conductive polysilicon layer is formed on the gate insulating layer 120, a metal layer is formed on the polysilicon layer, and a silicon nitride layer or the like is formed on the metal layer. These layers are formed by etching into the shapes of the gate electrodes 130 and 150.

The polysilicon layer, metal layer, silicon nitride layer, and the like can be formed by using, for example, a chemical vapor deposition (CVD) method or the like.

Figure 2B:
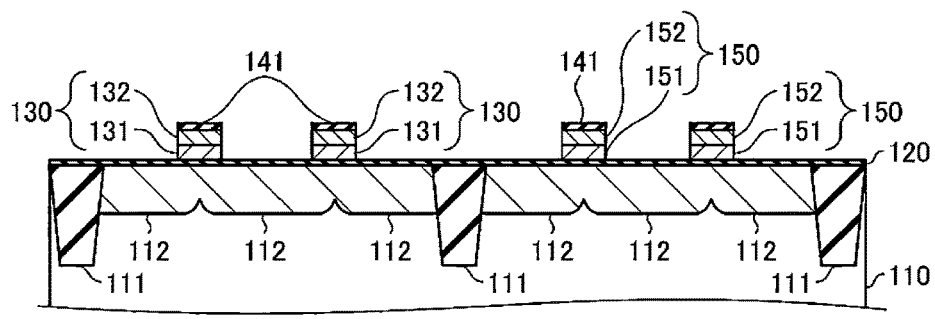

As shown in FIG. 2B, impurities are injected into the region surrounded by the element isolation layer 111 via the gate insulating layer 120. At this time, the cap layer 141 prevents the injection of impurities into the gate electrodes 130 and 150.

Further, although the injection of impurities directly under the gate electrodes 130 and 150 is hindered, impurities can be diffused up to a predetermined depth of the substrate 110, and also directly under the gate electrodes 130 and 150 by annealing or the like.

As a result, the diffusion region 112 is formed in substantially the entire region surrounded by the element isolation layer 111.

Figure 2C:
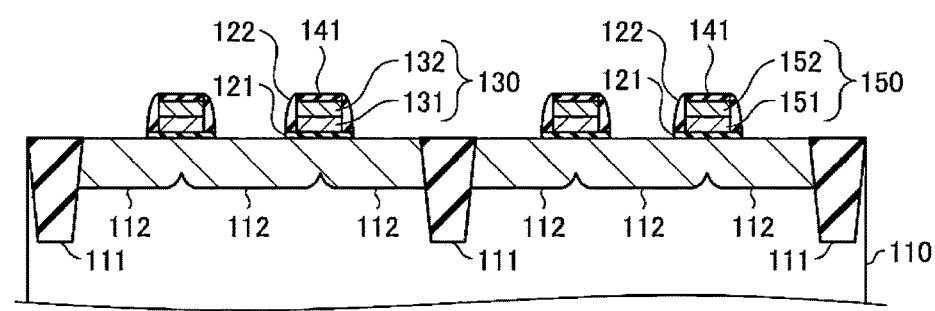

As shown in FIG. 2C, the spacer layer 122 is formed on the side surfaces of the gate electrodes 130 and 150 and the cap layer 141. Specifically, for example, an insulating layer such as a silicon oxide layer covering the whole of the gate electrodes 130 and 150 and the cap layer 141 is formed, and the insulating layer is etched back until the cap layer 141 on the gate electrodes 130 and 150 is exposed.

Further, the gate insulating layer 120 of the portion not covered by the gate electrodes 130 and 150, the cap layer 141, and the spacer layer 122 are removed by etching, and the gate insulating layer 121 separated for each of the gate electrodes 130 and 150 is formed at a position overlapping the gate electrodes 130 and 150, the cap layer 141, and the spacer layer 122.

Figure 2D:
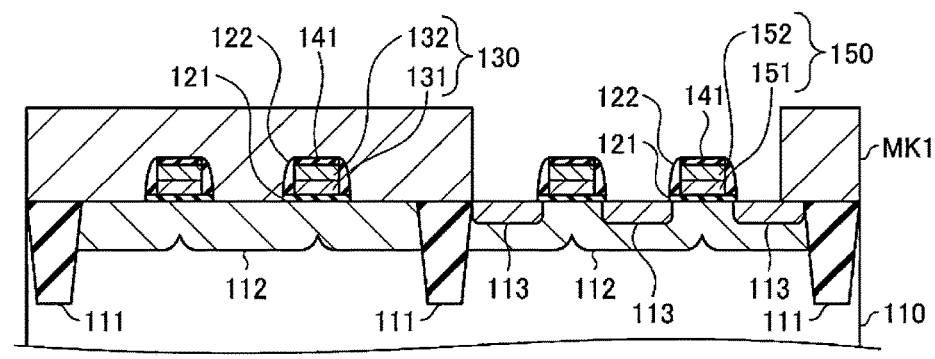

As shown in FIG. 2D, among the regions surrounded by the element isolation layer 111, a mask layer MK1 such as a resist layer that covers the region where the gate electrode 130 is formed and has an open region where the gate electrode 150 is formed is formed.

Moreover, impurities are further injected into the region where the gate electrode 150 is formed, and the impurities are diffused up to a predetermined depth of the substrate 110 by annealing or the like. At this time, the cap layer 141 prevents the injection of impurities into the gate electrode 150.

At this time, the impurities may wrap around to the lower surface side of the gate insulating layer 121 at a position overlapping the spacer layer 122 to the extent that the impurities do not reach directly under the gate electrode 150.

As a result, the diffusion region 113 is formed in the region in the element isolation layer 111 except directly under the gate electrode 150.

Thereafter, the mask layer MK1 is removed.

Figure 3A:
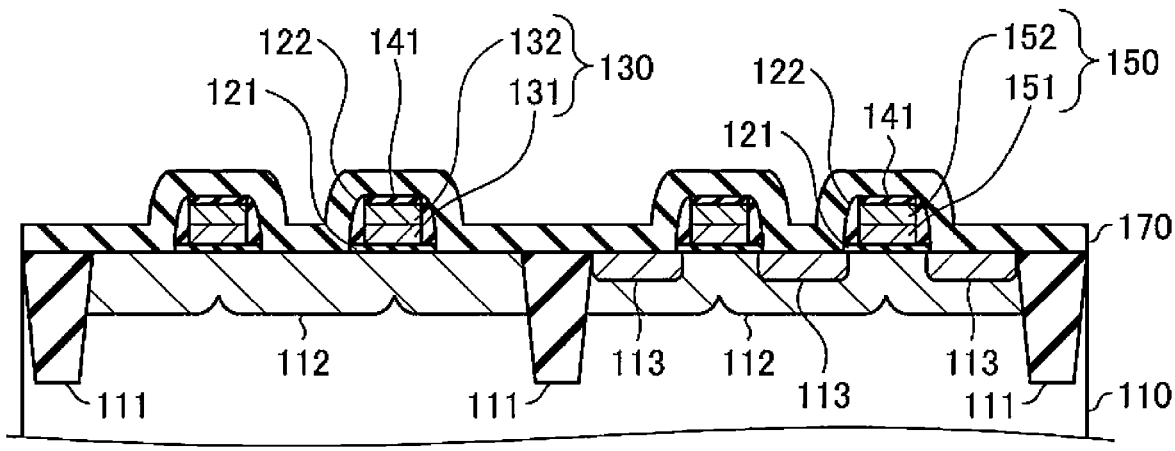
FIGS. 3A to 3C are diagrams illustrating a part of the procedure of the method for manufacturing the semiconductor device according to the first embodiment in order.

As shown in FIG. 3A, for example, the block layer 170 covering the gate insulating layer 121, the gate electrodes 130 and 150, the cap layer 141, and the spacer layer 122 is formed on the entire surface of the substrate 110.

Preferably, the block layer 170 is a single block layer 170 and has a thickness such that the sidewall 183 by the liner layer 181 can be formed on the side surface thereof.

Figure 3B:
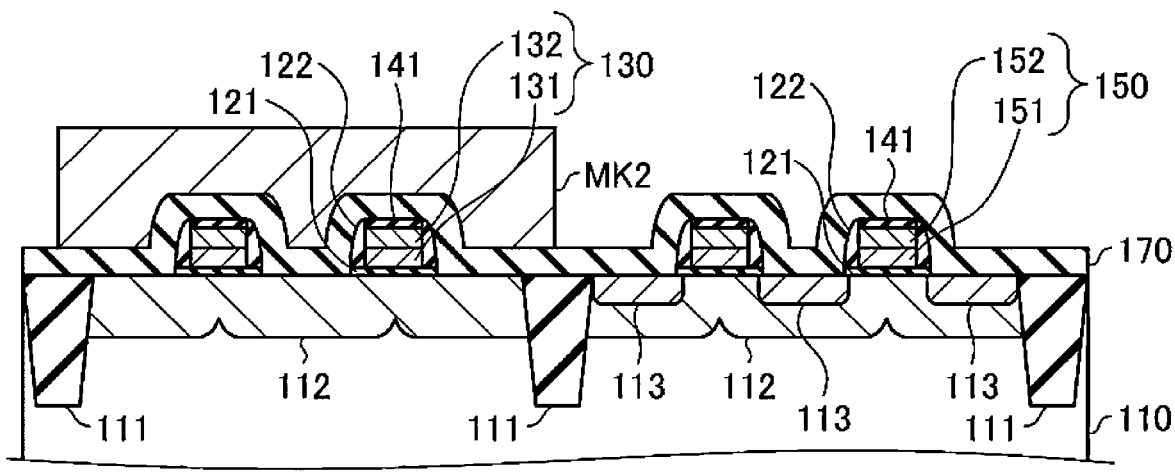

As shown in FIG. 3B, among the regions surrounded by the element isolation layer 111, a mask layer MK2 such as a resist layer that covers the region where the gate electrode 130 is formed and has an open region where the gate electrode 150 is formed is formed.

Figure 3C:
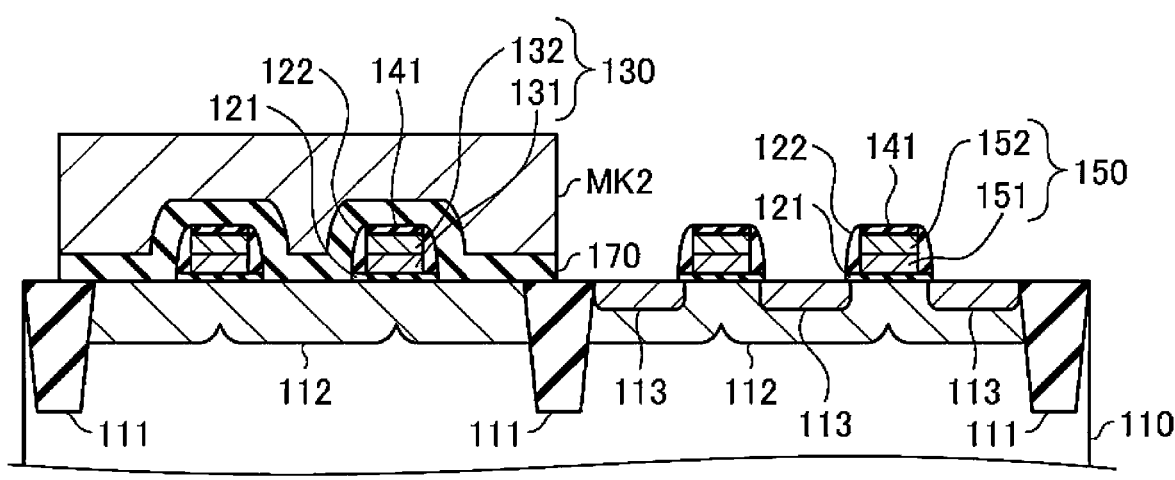

As shown in FIG. 3C, the block layer 170 exposed from the mask layer MK2 is removed by etching. As a result, the block layer 170 covering the region where the gate electrode 130 is formed is formed in the region surrounded by the element isolation layer 111. Thereafter, the mask layer MK2 is removed.

Figure 4A:
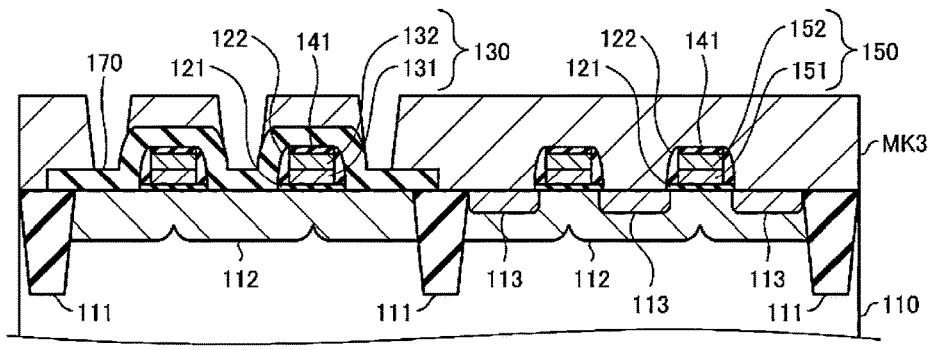
FIGS. 4A to 4D are diagrams illustrating a part of the procedure of the method for manufacturing the semiconductor device according to the first embodiment in order.

As shown in FIG. 4A, for example, a mask layer MK3 such as a resist layer having openings at predetermined positions on both sides of the gate electrode 130 in the X direction while covering substantially the entire substrate 110 is formed.

Figure 4B:
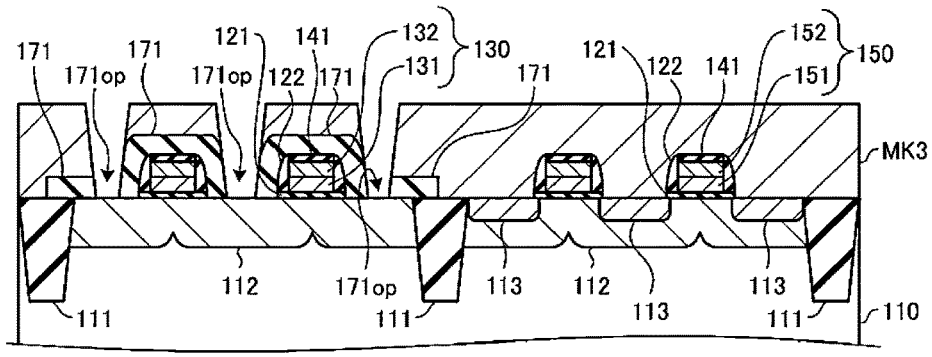

As shown in FIG. 4B, the block layer 170 exposed from the mask layer MK2 is removed by etching. As a result, the block layer 171 having an opening 171op at predetermined positions on both sides of the gate electrode 130 in the X direction is formed.

Figure 4C:
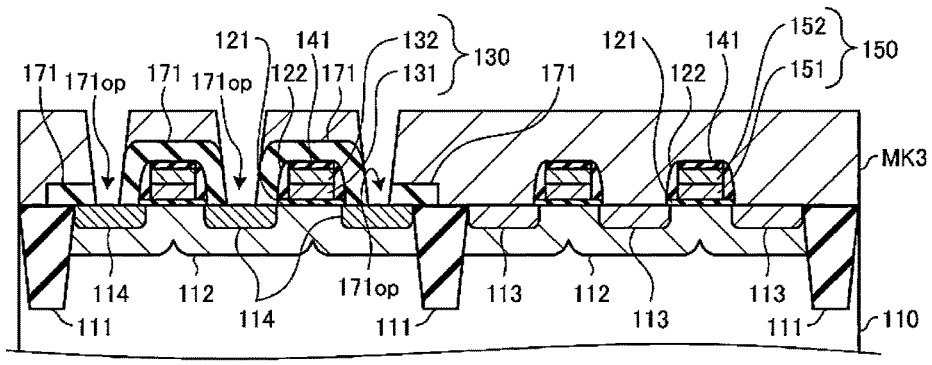

As shown in FIG. 4C, impurities are injected into the diffusion region 112 of the substrate 110 exposed from the opening 171op of the block layer 171, and the impurities are diffused up to a predetermined depth of the substrate 110 by annealing or the like.

At this time, impurities may wrap around to the lower surface side of the block layer 171 to some extent. Further, the impurities may wrap around to the lower surface side of the gate insulating layer 121 at a position overlapping the spacer layer 122 to the extent that the impurities do not reach directly under the gate electrode 130. In other words, by adjusting the thickness of the block layer 171, it is possible to prevent the wraparound of impurities directly under the gate electrode 130.

As a result, the diffusion region 114 is formed at predetermined positions on both sides of the gate electrode 130 in the X direction. At this time, the diffusion region 114 is self-aligned with respect to the opening 171op of the block layer 171.

That is, the impurities are mainly diffused from the opening 171op of the block layer 171 to the exposed substrate 110. Further, for example, the wraparound distance of impurities from the opening 171op to the lower surface side of the block layer 171 is also substantially equal on both sides in the X direction and both sides in the Y direction.

Therefore, as described above, the center positions between the block layers 171 on both sides of the opening 171op in the X direction and Y direction substantially coincide with the center positions of the diffusion region 114 in the X direction and the Y direction.

Thereafter, the mask layer MK3 is removed.

Figure 4D:
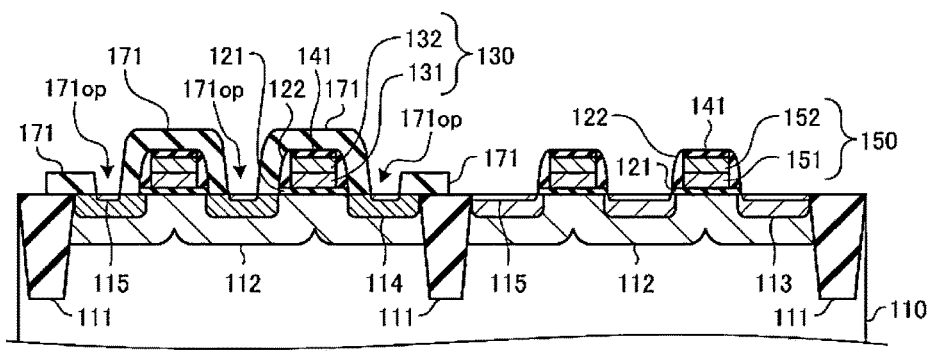

As shown in FIG. 4D, the silicide layer 115 is formed on the surface of the exposed substrate 110 in the region surrounded by the element isolation layer 111. The silicide layer 115 is, for example, a SALICIDE (Self-Aligned Silicide) layer formed on the surface of the exposed substrate 110 in a self-aligned manner.

Specifically, for example, a metal layer such as a tungsten layer is formed on the entire surface of the substrate 110 and annealed.

As a result, in the region where the gate electrode 130 is formed, the portion of the diffusion region 114 exposed from the block layer 171 covering the gate insulating layer 121, the gate electrode 130, the cap layer 141, and the spacer layer 122 is silicidized. The silicide layer 115, which is a compound of the metal of the metal layer and the silicon of the substrate, is formed.

At this time, the silicide layer 115 formed on the diffusion region 114 is self-aligned with respect to the diffusion region 114 and is also self-aligned with respect to the opening 171op of the block layer 171 in the same manner as when the diffusion region 114 is formed.

Therefore, as described above, the center positions between the block layers 171 on both sides of the opening 171op in the X direction and Y direction substantially coincide with the center positions of the silicide layer 115 in the X direction and the Y direction. Further, the center positions of the silicide layer 115 in the X direction and the Y direction also substantially coincide with the center positions of the diffusion region 114 in the X direction and the Y direction.

Further, in the region where the gate electrode 150 is formed, the silicide layer 115, which is a compound of the metal of the metal layer and the silicon of the substrate, is formed in the portion exposed from the gate electrode 130, the cap layer 141, and the gate insulating layer 121 of a lower layer of the spacer layer 122 in the diffusion region 113.

At this time, the silicide layer 115 formed on the diffusion region 113 is self-aligned with respect to the diffusion region 113. On the other hand, since the upper surface of the gate electrode 150 is covered with the cap layer 141, silicidization is prevented on the upper surface of the gate electrode 150.

Thereafter, the metal layer such as the tungsten layer excluding the silicidized portion is removed.

Figure 5A:
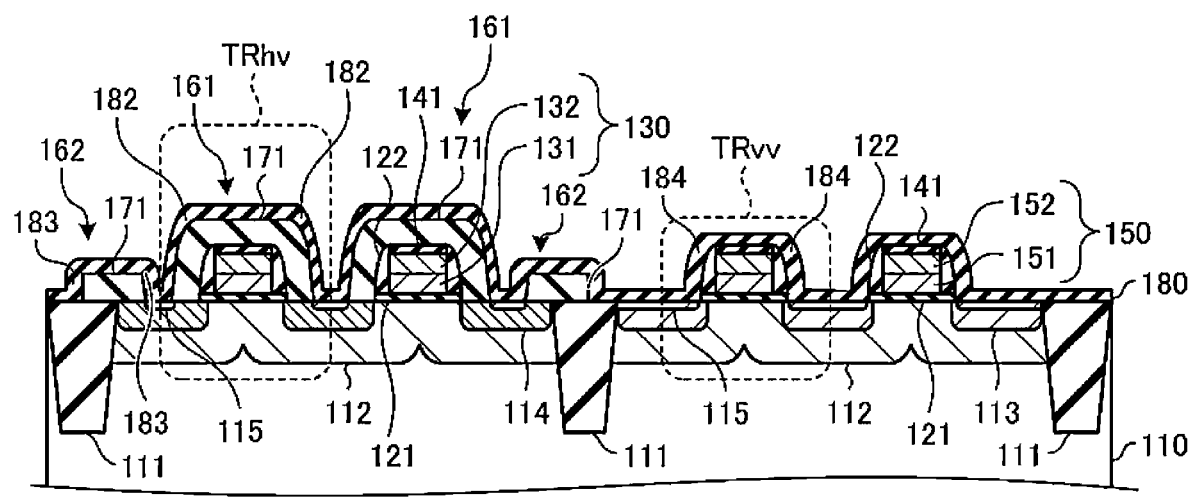
FIGS. 5A and 5B are diagrams illustrating a part of the procedure of the method for manufacturing the semiconductor device according to the first embodiment in order.

As shown in FIG. 5A, for example, a liner layer 180 that covers the entire surface of the substrate 110 is formed.

As a result, the gate insulating layer 121, the gate electrode 130, the cap layer 141, and the spacer layer 122 are covered with the liner layer 180 via the block layer 171, and sidewalls 182 are formed on both sides of the gate electrode 130 in the X direction. Further, the stacked body 161 is formed and the transistor TRhv is formed.

Further, the block layer 171 not including the gate electrode 130 is covered with the liner layer 180, and sidewalls 183 are formed on the side surfaces of the end portion of the block layer 171 on the diffusion region 114 and the end portion on the element isolation layer 111. Moreover, the stacked body 162 is formed.

Further, the gate insulating layer 121, the gate electrode 150, the cap layer 141, and the spacer layer 122 are covered with the liner layer 180, and sidewalls 184 are formed on both sides of the gate electrode 150 in the X direction. Moreover, the transistor TRvv is formed.

Figure 5B:
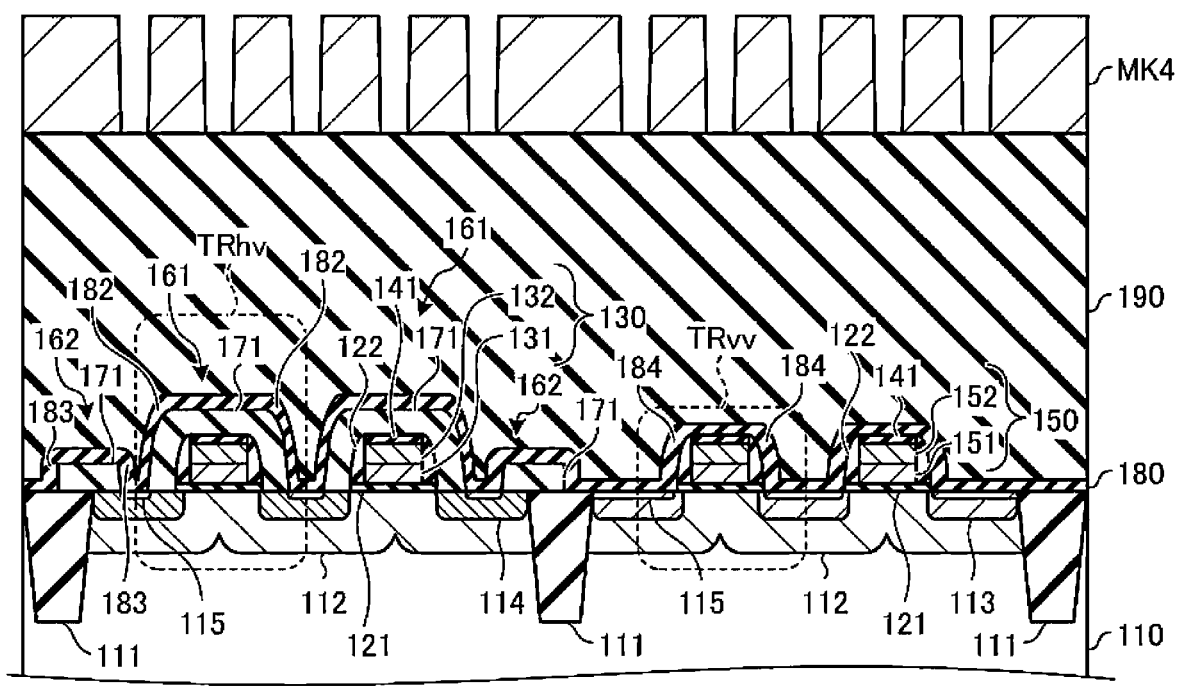

As shown in FIG. 5B, for example, an interlayer insulating layer 190 that covers the entire surface of the substrate 110 is formed. Further, a mask layer MK4 such as a resist layer having openings on the gate electrodes 130 and 150 and at predetermined positions on both sides of the gate electrodes 130 and 150 in the X direction is formed.

Figure 6:
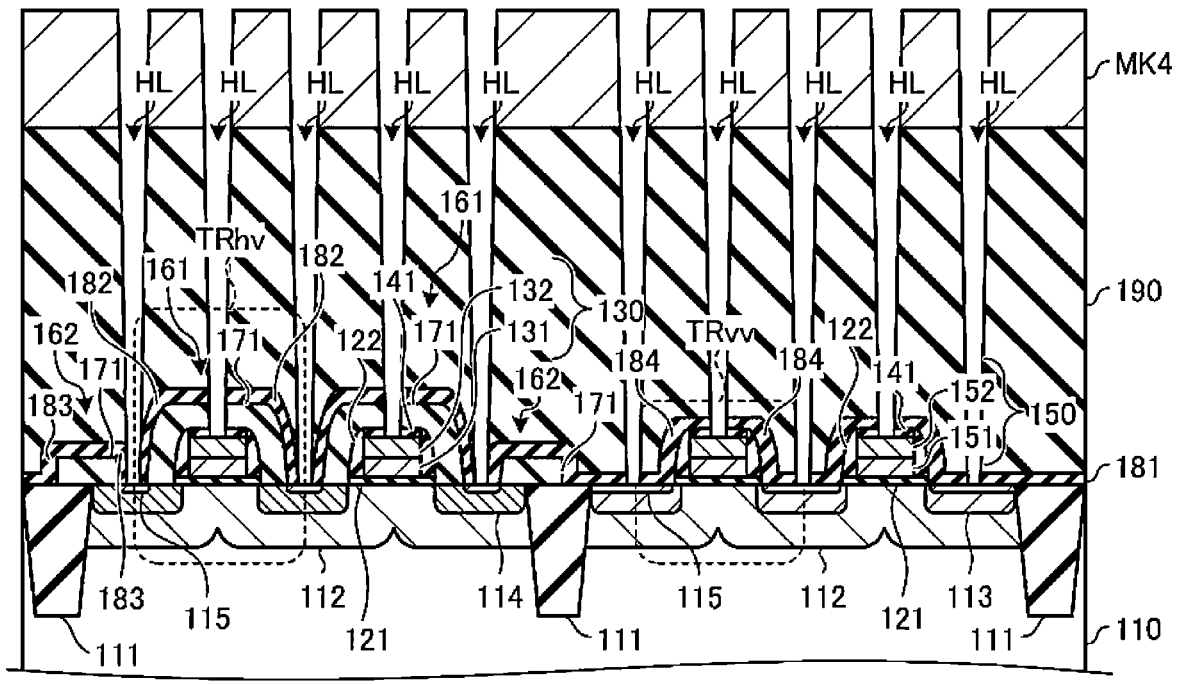
FIG. 6 is a diagram illustrating a part of the procedure of the method for manufacturing the semiconductor device according to the first embodiment in order.

As shown in FIG. 6, the interlayer insulating layer 190 of the portion exposed from the mask layer MK4 is penetrated by etching.

Further, on the gate electrode 130, a hole HL that penetrates the liner layer 180, the block layer 171, and the cap layer 141 and reaches the gate electrode 130 is formed.

Further, on both sides of the gate electrode 130 in the X direction, the hole HL that penetrates the liner layer 180 and the block layer 171 and reaches the silicide layer 115 on the diffusion region 114 is formed.

At this time, the hole HL between the gate electrodes 130 adjacent to each other in the X direction is in contact with at least one of the sidewalls 182 formed on the side surfaces of the gate electrodes 130 located on both sides in the X direction, on the side surface, and passes between the sidewalls 182 to reach the silicide layer 115.

At this time, the hole HL on one side of the gate electrode 130 at the end portion in the X direction is in contact with at least one of the sidewall 182 formed on the side surface of the gate electrode 130 on one side in the X direction and the sidewalls 183 formed on the side surface of the block layer 171 on the other side in the X direction, on the side surface, and passes between the sidewalls 182 and 183 to reach the silicide layer 115.

Further, on the gate electrode 150, the hole HL that penetrates the liner layer 180 and the cap layer 141 and reaches the gate electrode 150 is formed.

Further, on both sides of the gate electrode 150 in the X direction, the hole HL that penetrates the liner layer 180 and reaches the silicide layer 115 on the diffusion region 113 is formed.

At this time, as described above, since there is a relatively large distance between the sidewalls 184 facing each other on the side surfaces of the gate electrodes 150 adjacent to each other in the X direction, the hole HL reaches the silicide layer 115 without contacting any of the sidewalls 184, for example.

At this time, since the hole HL on one side of the gate electrode 150 at the end portion in the X direction is also formed at a sufficient distance from the sidewall 184 formed on the side surface of the gate electrode 150 on one side in the X direction, the hole HL reaches the silicide layer 115 without contacting the sidewall 184 of the gate electrode 150 at the end portion in the X-direction.

Further, as described above, the liner layer 181 through which the hole HL penetrates is formed by etching using the mask layer MK4.

Thereafter, the mask layer MK4 is removed, and each hole HL is filled with tungsten or the like. As a result, contacts CGhv and CGvv respectively connected to the gate electrodes 130 and 150 are formed. In addition, contacts CShv and CSvv are formed which are respectively connected to the silicide layers 115 formed in the diffusion regions 114 and 113 near the respective gate electrodes 130 and 150.

From the above, the semiconductor device 100 of the first embodiment is manufactured.

Here, the alignment accuracy of the contact CShv with respect to the diffusion region 114 and the silicide layer 115 will be described with reference to FIG. 7.

Figure 7:
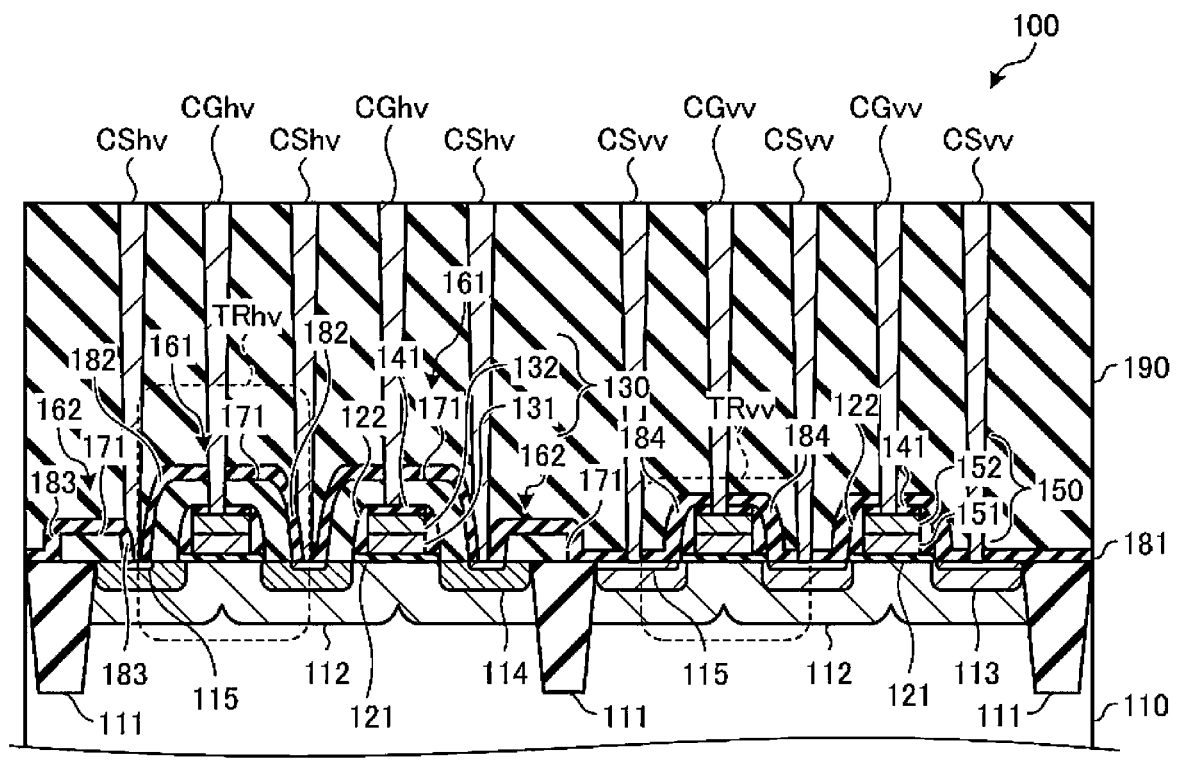
FIG. 7 is a diagram showing an example of a case where the contacts of the semiconductor device according to the first embodiment are formed in a misaligned state.

FIG. 7 is a diagram showing an example of a case where the contact CShv of the semiconductor device 100 according to the first embodiment is formed in a misaligned state. More specifically, FIG. 7 shows a cross section of the semiconductor device 100 having the misaligned contact CShv along the X direction, which corresponds to FIG. 1A described above.

As shown in FIG. 7, the contacts CShv, CGhv, CSvv, and CGvv connected to the transistors TRhv and TRvv are shifted from the regular position according to the design to the left side of the paper surface, that is, to one side in the X direction. Such misalignment occurs, for example, when the mask layer MK4 shown in FIG. 5B described above is formed with a superposition deviation with respect to the transistors TRhv and TRvv.

Therefore, the contacts CGhv and CGvv are connected to the gate electrodes 130 and 150 of the transistors TRhv and TRvv at positions shifted to the left side of the paper surface from the center positions in the X direction of the transistors TRhv and TRvv, respectively.

Further, the contacts CShv and CSvv are formed at positions shifted to the left side of the paper surface from the center positions of the diffusion region 114 and the silicide layer 115 of the transistor TRhv, and the diffusion region 113 and the silicide layer 115 of the transistor TRvv in the X direction, respectively.

At this time, the diffusion region 113 and the Silicide layer 115 of the transistor TRvv have a relatively large size. Therefore, the contact CSvv is connected to the diffusion region 113 and the silicide layer 115 without deviating from the diffusion region 113 and the silicide layer 115.

On the other hand, the size of the diffusion region 114 and the silicide layer 115 of the transistor TRhv is smaller than that of the diffusion region 113 and the silicide layer 115 of the transistor TRvv, and a part of the lower end portion of the contact CShv is formed at the position deviated from the diffusion region 114 and the silicide layer 115.

However, between the transistors TRhv adjacent to each other in the X direction, the portion of the contact CShv that is deviated from the diffusion region 114 and the silicide layer 115 comes into contact with the sidewall 182 of the transistor TRhv on one side in the X direction. As a result, the contact CShv is terminated without reaching the upper surface of the substrate 110.

Further, on one side in the X direction of the transistor TRhv at the end portion in the X-direction, the portion of the contact CShv that is deviated from the diffusion region 114 and the silicide layer 115 comes into contact with the sidewall 183 of the block layer 171 that does not include the gate electrode 130 on one side in the X direction. As a result, the contact CShv is terminated without reaching the upper surface of the substrate 110.

As shown in FIG. 6 above, the hole HL penetrates the liner layer 180 on the upper surface of the silicide layer 115. At this time, by adjusting the etching conditions, the hole HL is formed while penetrating the thin liner layer 180 on the upper surface of the silicide layer 115, without penetrating the sidewalls 182 and 183 which are formed on the side surfaces of the gate electrode 130 and the block layer 171 and thick in the stacking direction of the stacked bodies 161 and 162. As a result, the contact CShv having a part of the lower end portion terminated by the sidewalls 182 and 183 is formed.

As described above, in the semiconductor device 100, even when a part of the contact CShv is formed at a position deviated from the diffusion region 114 and the silicide layer 115, the lower end portion of the contact CShv is self-aligned in the diffusion region 114 and the silicide layer 115.

(Summary)

In recent years, semiconductor devices including transistors are miniaturized. On the other hand, in an HV transistor that requires a high breakdown voltage, there is an issue of reducing the contact resistance between the contact that applies a high voltage to the source and drain and the diffusion region. Therefore, high-concentration impurities may be further injected into the portion connected to the contact in the diffusion region to reduce the contact resistance. In addition, a silicide layer may be formed on the high-concentration diffusion region by using a SALICIDE forming technique to further reduce the contact resistance.

At this time, in order to maintain the high breakdown voltage of the transistor, it is preferable that the high-concentration diffusion region is surrounded by a low-concentration diffusion region having a relatively high resistance, so that a predetermined distance is maintained from the element isolation layer and the gate electrode. Further, in the silicide layer, in order to reduce the junction leak and maintain the junction breakdown voltage, it is preferable that the silicide layer is surrounded by a high-concentration diffusion region having a predetermined width, and a high-concentration diffusion region is allocated with a sufficient width between the silicide layer and the element isolation layer.

However, considering that impurities are diffused in the substrate, it is difficult to allocate a sufficient distance between the high-concentration diffusion region, and the element isolation layer and the gate electrode while the semiconductor device is miniaturized. There is also a concern that the opening size of the resist pattern used when injecting impurities will reach the exposure limit.

For this reason, for example, a sufficient increase in the impurity concentration may be restricted. Alternatively, the low-concentration diffusion region is to be formed in a sufficiently large size, which may hinder the miniaturization of the semiconductor device. Further, from the viewpoint of the alignment accuracy between the silicide layer and the high-concentration diffusion region, the high-concentration diffusion region is to be formed in a sufficiently large size, which may further hinder the miniaturization of the semiconductor device. In addition, it becomes difficult to align the high-concentration diffusion region or the silicide layer with the contact.

According to the semiconductor device 100 of the first embodiment, the stacked body 161 including the gate electrode 130 and the sidewalls 182 provided on both sides of the gate electrode 130 in the X direction via the block layer 171, and the stacked body 162 including the block layer 171 not including the gate electrode 130, and the sidewalls 183 provided on both sides of the block layer 171 in the X direction are provided on both sides of the diffusion region 114 in the X direction, respectively.

When forming the diffusion region 114, the block layer 171 of the stacked body 161 and the block layer 171 of the stacked body 162 are used as masks for impurity injection, and the diffusion region 114 is formed in a self-aligned manner. Further, the same block layer 171 is used as a mask when forming the silicide layer 115.

As a result, the alignment of the diffusion region 114 with respect to the element isolation layer 111 and the gate electrode 130 and the alignment of the silicide layer 115 with respect to the diffusion region 114 can be unified, and the alignment accuracy thereof can be improved. Therefore, the impurity concentration in the diffusion region 114 can be sufficiently increased to reduce the contact resistance, and the size of the diffusion region 114 can be reduced to miniaturize the semiconductor device 100.

According to the semiconductor device 100 of the first embodiment, the contact CShv that passes between the sidewall 182 of the stacked body 161 and the sidewall 183 of the stacked body 162 and is electrically connected to the diffusion region 114 is provided. As a result, the contact CShv is self-aligned with respect to the diffusion region 114 and the silicide layer 115. Therefore, it is possible to reduce the increase in resistance of the contact CShv and the electrical connection failure between the contact CShv and the diffusion region 114 and the silicide layer 115.

First Modification

In the above-described first embodiment, as shown in FIGS. 4A to 4B, the mask layer MK3 is used to form the block layer 171 having the opening 171op at the formation position of the diffusion region 114. However, it is also possible to use a simpler mask layer when providing the opening 171op in the block layer 170. Hereinafter, an example of a method for manufacturing a semiconductor device using a simple mask layer will be described with reference to FIGS. 8A to 8D and 9A and 9B.

FIGS. 8A to 8D and 9A and 9B are diagrams illustrating a part of the procedure of the method for manufacturing a semiconductor device according to the first modification of the first embodiment in order. More specifically, FIGS. 8A to 8D and 9A and 9B show a cross section of the semiconductor device along the X direction in the manufacturing process of the first modification.

In the semiconductor device of the first modification, the same reference numerals are given to the same configurations as those of the above-described first embodiment, and the descriptions thereof will be omitted. Further, also in the semiconductor device of the first modification, the direction along the X direction may be referred to as the first direction, and the direction along the Y direction may be referred to as the second direction.

The method for manufacturing the semiconductor device of the first modification can be the same process as that of the semiconductor device 100 of the first embodiment up to the process shown in FIG. 3C described above.

Figure 8A:
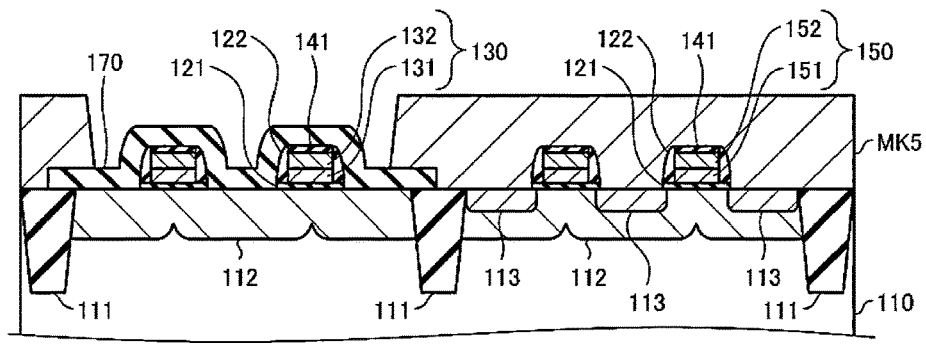
FIGS. 8A to 8D are diagrams illustrating a part of a procedure of a method for manufacturing a semiconductor device according to a first modification of the first embodiment in order.

As shown in FIG. 8A, instead of the mask layer MK3 of FIG. 4A described above, for example, a mask layer MK5 such as a resist layer is formed that covers substantially the entire substrate 110 and has an opening in the region where the gate electrode 130 is formed, among the regions surrounded by the element isolation layer 111.

As a result, a plurality of gate electrodes 130 adjacent to each other in the X direction and covered with the block layer 170 are exposed from the opening of the mask layer MK5. However, the opening of the mask layer MK5 is formed at a position sufficiently inward from the element isolation layer 111 surrounding the region where the gate electrode 130 is formed.

Figure 8B:
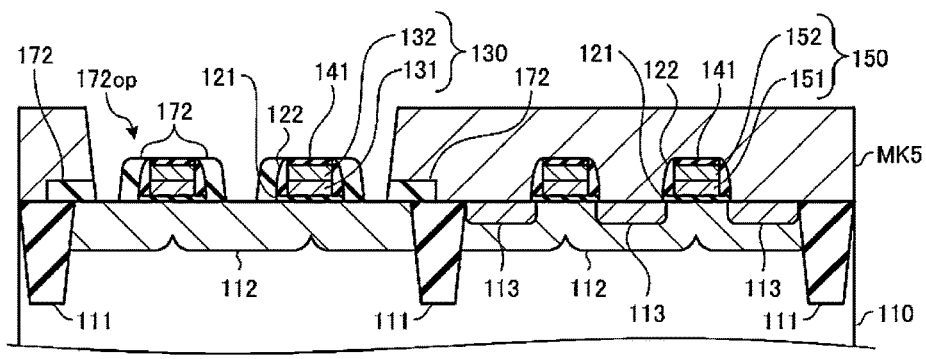

As shown in FIG. 8B, the block layer 170 exposed from the mask layer MK5 is removed by etching. As a result, a block layer 172 having an opening 172op in which predetermined positions of the upper surfaces of the substrates 110 on both sides of the plurality of gate electrodes 130 adjacent to each other in the X direction and a predetermined position of the upper surface of the cap layer 141 provided on the plurality of gate electrodes 130 are exposed is formed.

That is, the block layer 172 is formed with the opening 172op surrounded by the block layer 172 remaining on the element isolation layer 111 side. However, in the opening 172op, the block layer 172 provided on the side surface of the gate electrode 130 remains without being removed.

Figure 8C:
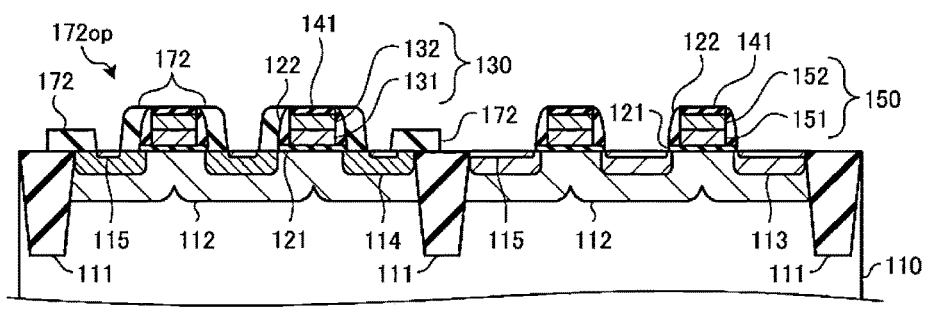

As shown in FIG. 8C, while the region where the gate electrode 150 is formed is still covered with the mask layer MK5, impurities are injected into the diffusion region 112 of the substrate 110 exposed from the opening 172op of the block layer 172. Then, the impurities are diffused up to a predetermined depth of the substrate 110 by annealing or the like. At this time, by adjusting the thickness of the block layer 172, it is possible to prevent the wraparound of impurities directly under the gate electrode 130.

At this time, the block layer 172 above the gate electrode 130 is removed. However, even in this case, in addition to the block layer 172 remaining on the element isolation layer 111 side and the block layer 172 remaining on the side surface of the gate electrode 130, the gate insulating layer 121, the gate electrode 130, the cap layer 141, and the spacer layer 122 function as a mask for impurity injection.

Therefore, it is possible to form a diffusion region 114 that is self-aligned with respect to the opening 172op of the block layer 172 while maintaining a predetermined distance from the gate electrode 130, and including the region directly under the gate electrode 130.

Further, as described above, although the block layer 172 above the gate electrode 130 is removed, the cap layer 141 on the upper surface of the gate electrode 130 prevents the injection of impurities into the gate electrode 130.

After forming the diffusion region 114, the mask layer MK5 is removed, and in the region where the gate electrode 130 is formed, the surface of the diffusion region 114 of the substrate 110 exposed from the opening 172op of the block layer 172 is silicidized to form the silicide layer 115 in a self-aligned manner with respect to the diffusion region 114 and the opening 172op of the block layer 172.

As described above, the silicide layer 115 is also formed by using the block layer 172 remaining on the element isolation layer 111 side that becomes a mask for impurity injection, the block layer 172 remaining on the side surface of the gate electrode 130, the gate insulating layer 121, the gate electrode 130, the cap layer 141, and the spacer layer 122 as masks. Since the upper surface of the gate electrode 130 is covered with the cap layer 141, silicidization is prevented.

On the other hand, in the region where the gate electrode 150 is formed, the silicide layer 115 is formed in the portion of the diffusion region 113 exposed from the gate electrode 150, the cap layer 141, and the gate insulating layer 121 of the lower layer of the spacer layer 122. Also in the gate electrode 150, the silicidization of the gate electrode 150 is prevented by the cap layer 141 on the upper surface of the gate electrode 150.

Thereafter, as shown in FIGS. 8D to 9B, the semiconductor device of the first modification is manufactured in the same manner as the semiconductor device 100 of the first embodiment described above.

Figure 8D:
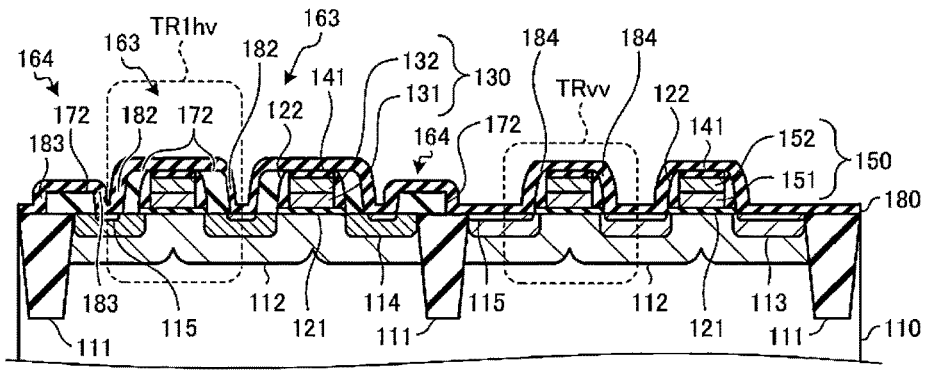

As shown in FIG. 8D, for example, the liner layer 180 that covers the entire surface of the substrate 110 is formed.

As a result, the gate insulating layer 121, the gate electrode 130, the cap layer 141, and the spacer layers 122 and the block layer 172 on both sides of the gate electrode 130 in the X direction are covered with the liner layer 180, and the sidewalls 182 are formed on both sides of the gate electrode 130 in the X direction. Further, a stacked body 163 as the first structure is formed, and the transistor TR1hv is formed.

Further, the block layer 172 not including the gate electrode 130 is covered with the liner layer 180, and the sidewalls 183 are formed on the side surfaces of the end portion of the block layer 172 on the diffusion region 114, and the end portion on the element isolation layer 111. In addition, a stacked body 164 as a second structure is formed.

Further, the gate insulating layer 121, the gate electrode 150, the cap layer 141, and the spacer layer 122 are covered with the liner layer 180, and sidewalls 184 are formed on both sides of the gate electrode 150 in the X direction. Moreover, the transistor TRvv is formed.

Figure 9A:
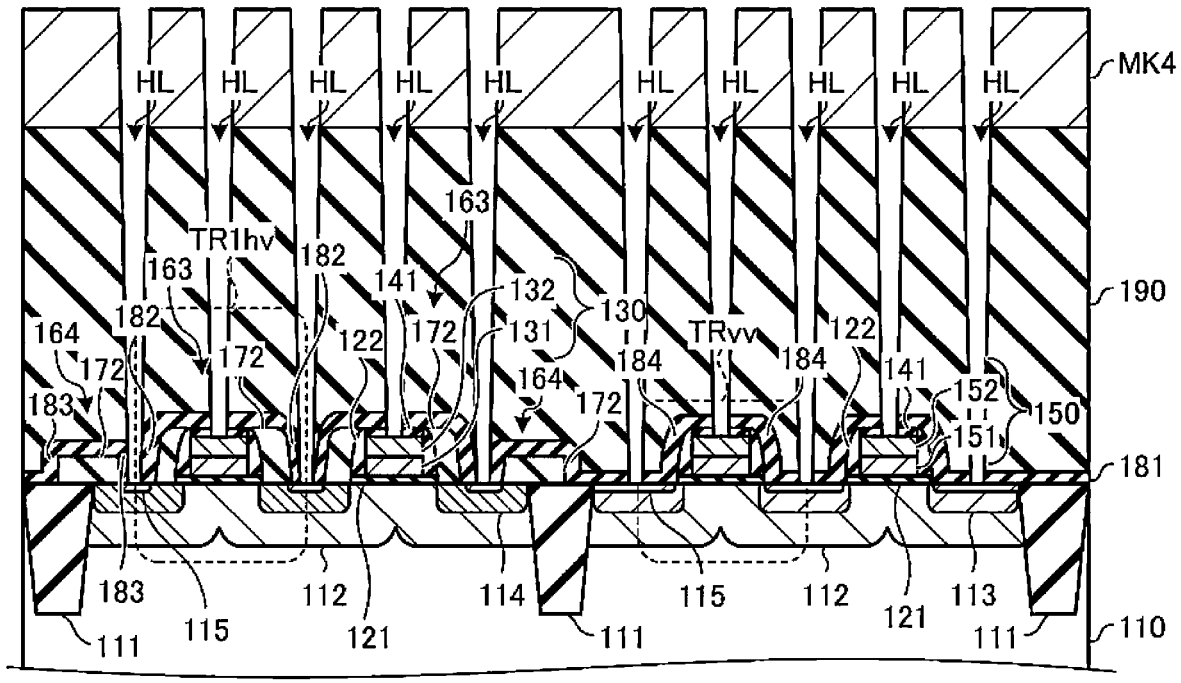
FIGS. 9A and 9B are diagrams illustrating a part of the procedure of the method for manufacturing the semiconductor device according to the first modification of the first embodiment in order.

As shown in FIG. 9A, for example, an interlayer insulating layer 190 that covers the entire surface of the substrate 110 is formed. Further, the mask layer MK4 such as a resist layer having openings on the gate electrodes 130 and 150 and at predetermined positions on both sides of the gate electrodes 130 and 150 in the X direction is formed.

Further, the interlayer insulating layer 190, the liner layer 180, the cap layer 141, and the like of the portion exposed from the mask layer MK4 are appropriately penetrated by etching. As a result, a plurality of holes HL reaching the upper surface of the gate electrodes 130 and 150 and the substrates 110 on both sides of the gate electrodes 130 and 150 in the X direction are formed, respectively.

Figure 9B:
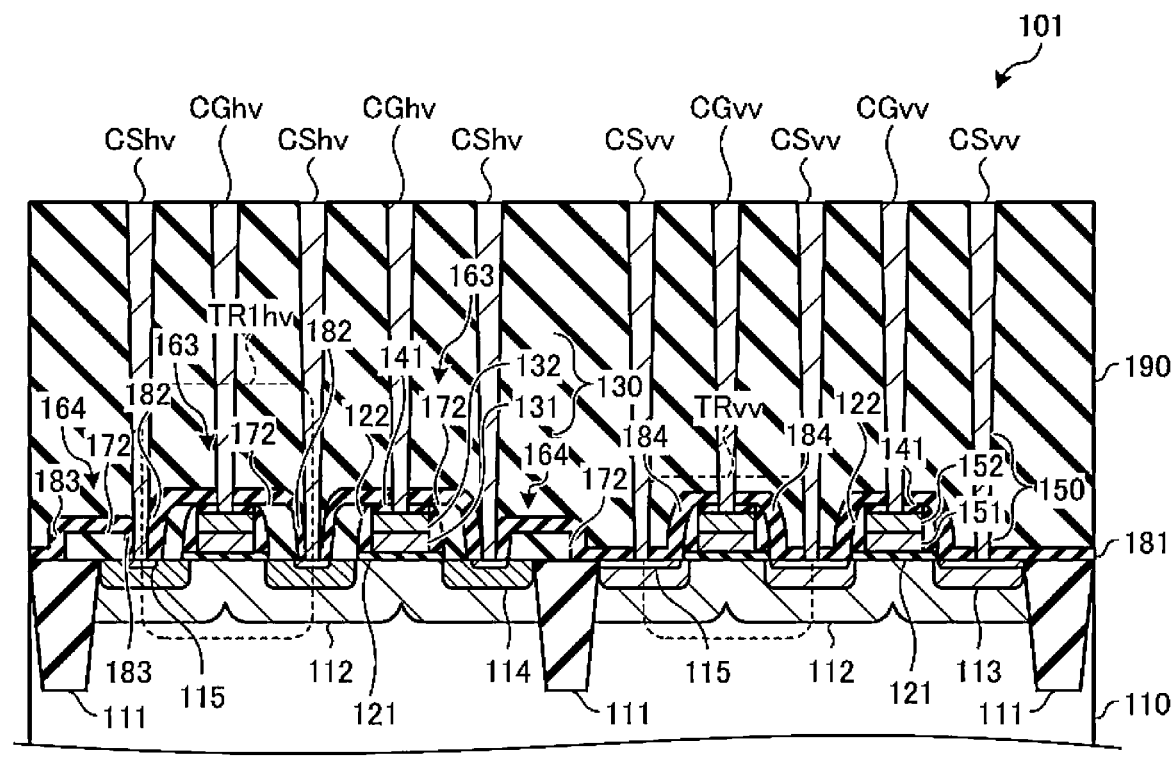

As shown in FIG. 9B, the mask layer MK4 is removed and each hole HL is filled with tungsten or the like. As a result, contacts CGhv and CGvv connected to the gate electrodes 130 and 150 are formed. In addition, contacts CShv and CSvv are formed which are connected to the silicide layers 115 formed in the diffusion regions 114 and 113 near the gate electrodes 130 and 150, respectively.

From the above, a semiconductor device 101 of the first modification is manufactured.

According to the method for manufacturing the semiconductor device 101 of the first modification, the mask layer MK5 having an opening in which the gate electrode 130 covered with the block layer 170 is exposed is used to remove the block layer 170 exposed from the opening in the region surrounded by the element isolation layer 111.

By using such a mask layer MK5, it is not necessary to align the mask layer MK5 so that the mask layer MK5 has openings at predetermined positions on both sides of the gate electrode 130 in the X direction. Therefore, the exposure load when forming the mask layer MK5 can be reduced.

Further, since the exposure load is reduced, the opening of the mask layer MK5 can be made smaller to form the diffusion region 114 and the silicide layer 115 in a narrower area, and the semiconductor device 101 can be further miniaturized.

According to the semiconductor device 101 of the first modification, other effects similar to those of the above-described first embodiment are obtained.

Second Modification

In the above-described first embodiment, for example, the transistor TRhv has a polymetal gate structure including the polysilicon electrode 131 and the metal electrode 132. However, the configuration of the first embodiment can be applied to a transistor having a polygate structure, for example. Hereinafter, an example of the application of the above configuration to a transistor having a polygate structure will be described with reference to FIGS. 10 to 12C.

Figure 10:
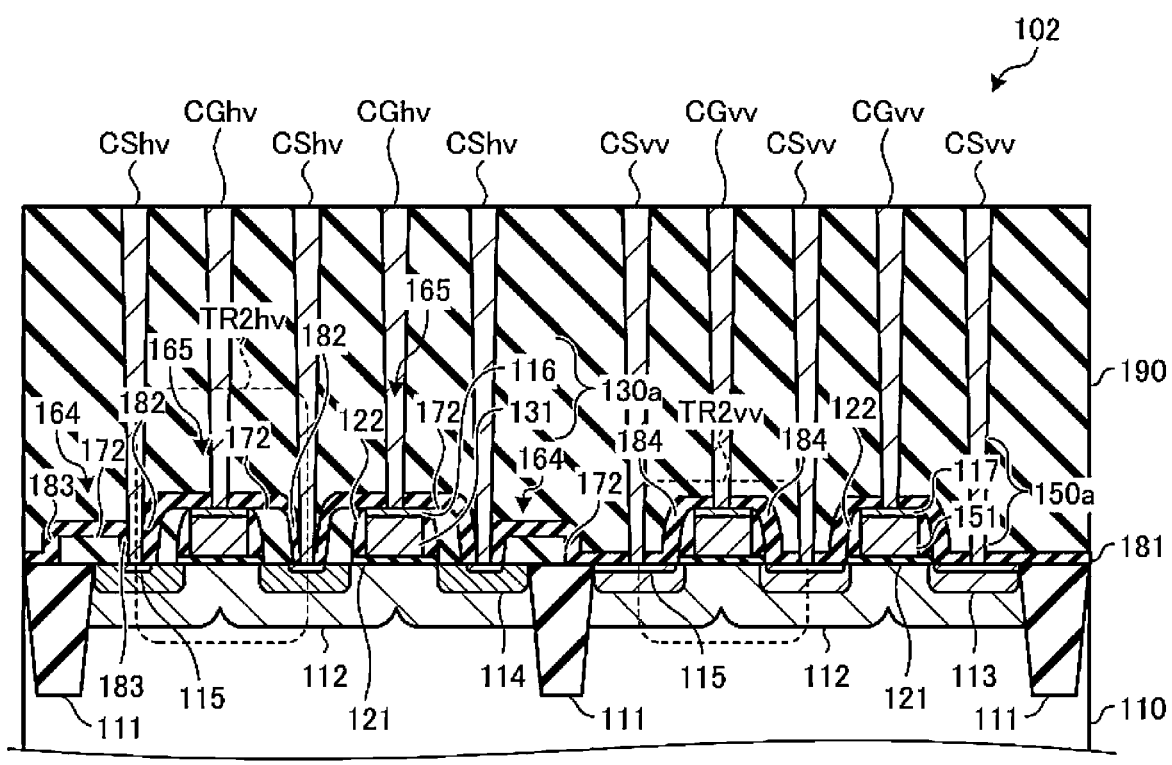
FIG. 10 is a diagram showing an example of a configuration of a semiconductor device according to a second modification of the first embodiment.

FIG. 10 is a diagram showing an example of the configuration of a semiconductor device 102 according to the second modification of the first embodiment. More specifically, FIG. 10 shows a cross section of the semiconductor device 102 along the X direction, which corresponds to FIG. 1A described above.

In the semiconductor device 102 of the second modification, the same reference numerals are given to the same configurations as those in the first embodiment, and the descriptions thereof will be omitted. Further, also in the semiconductor device 102 of the second modification, the direction along the X direction may be referred to as the first direction, and the direction along the Y direction may be referred to as the second direction.

As shown in FIG. 10, among the regions separated by the element isolation layer 111, in the region where the diffusion region 114 is provided, a plurality of transistors TR2hv are provided apart from each other in the X direction. A gate electrode 130a of the transistor TR2hv extends in the direction along the Y direction in the region between the diffusion regions 114 located in the X direction.

The gate electrode 130a includes a polysilicon electrode 131 provided on the gate insulating layer 121 and a SALICIDE layer 116 provided on the polysilicon electrode 131. As will be described later, the SALICIDE layer 116 is a tungsten silicide layer, a nickel silicide layer, a nickel platinum silicide layer, or the like formed by silicidizing the upper surface of the polysilicon electrode 131 in a self-aligned manner.

The block layer 172 is provided on the side surface of the gate electrode 130a via a spacer layer 122. The block layer 172 is not formed on the upper surface of the gate electrode 130a, for example. Therefore, the gate electrode 130a is covered with the liner layer 181 directly on the upper surface thereof and via the spacer layer 122 and the block layer 172 on the side surface.

Further, a structure including the gate insulating layer 121, the gate electrode 130a, the spacer layer 122, and the block layers 172 and the sidewalls 182 on both sides of the gate electrode 130a in the X direction is referred to as a stacked body 165 as a first structure.

The contact CGhv penetrates the interlayer insulating layer 190 and the liner layer 181 to be connected to the SALICIDE layer 116 of the gate electrode 130a. The contact CShv penetrates the interlayer insulating layer 190 and the liner layer 181 to be connected to the SALICIDE layers 116 on both sides of the gate electrode 130a in the X direction.

Among the regions separated by the element isolation layer 111, a plurality of transistors TR2vv are provided apart from each other in the X direction in the region where the diffusion region 113 is provided. A gate electrode 150a of the transistor TR2vv extends in the direction along the Y direction in the region between the diffusion regions 113 located in the X direction.

The gate electrode 150a has a polysilicon electrode 151 provided on the gate insulating layer 121 and a SALICIDE layer 117 provided on the polysilicon electrode 151. As will be described later, the SALICIDE layer 117 is a layer formed by siliciding the upper surface of the polysilicon electrode 151 in a self-aligned manner and is made of the same material as the SALICIDE layer 116 described above.

The gate electrode 150a is covered with the liner layer 181 directly on the upper surface thereof and via the spacer layer 122 on the side surface.

The contact CGvv penetrates the interlayer insulating layer 190 and the liner layer 181 to be connected to the SALICIDE layer 117 of the gate electrode 150a. The contact CSvv penetrates the interlayer insulating layer 190 and the liner layer 181 to be connected to the SALICIDE layers 117 on both sides of the gate electrode 150a in the X direction.

The semiconductor device 102 of the second modification can also be manufactured by the same method as the method for manufacturing the semiconductor device of the first embodiment or the first modification, except for the processes related to the formation of the gate electrodes 130a and 150a. Hereinafter, an example in which the semiconductor device 102 of the second modification is manufactured by using the method of the first modification described above will be described.

FIGS. 11A to 12C are diagrams illustrating a part of the procedure of the method for manufacturing the semiconductor device 102 according to the second modification of the first embodiment in order. More specifically, FIGS. 11A to 12C show a cross section of the semiconductor device 102 in the manufacturing process along the X direction.

Figure 11A:
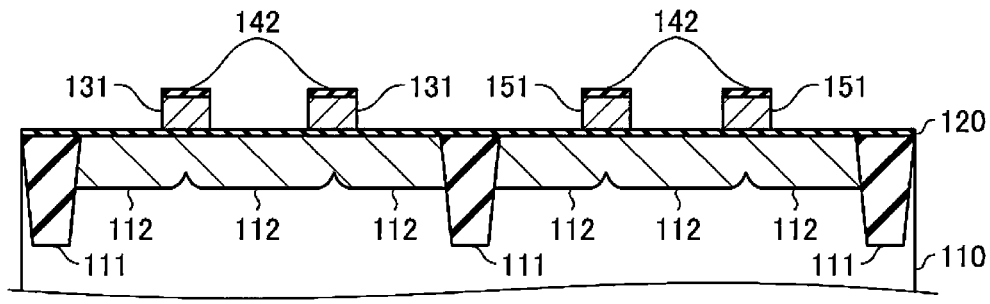
FIGS. 11A to 11D are diagrams illustrating a part of a procedure of a method for manufacturing the semiconductor device according to the second modification of the first embodiment in order.

As shown in FIG. 11A, the element isolation layer 111 is formed on a substrate 110 such as a silicon substrate. Further, the gate insulating layer 120 is formed on the entire upper surface of the substrate 110.

Further, the polysilicon electrodes 131 and 151 and the cap layer 142 are formed on the gate insulating layer 120 in the region surrounded by the element isolation layer 111. The polysilicon electrodes 131 and 151 and the cap layer 142 are formed, for example, by forming a conductive polysilicon layer on the gate insulating layer 120, forming a silicon nitride layer or the like on the polysilicon layer, and etching molding these layers into the shapes of the polysilicon electrodes 131 and 151.

Further, impurities are injected into the region surrounded by the element isolation layer 111 via the gate insulating layer 120, and the impurities are diffused up to a predetermined depth of the substrate 110, and also directly under the polysilicon electrodes 131 and 151 by annealing or the like. As a result, the diffusion region 112 is formed in substantially the entire region surrounded by the element isolation layer 111.

Figure 11B:
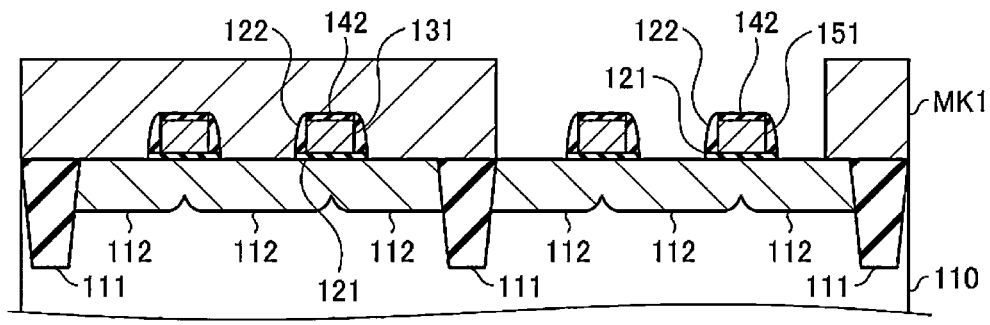

As shown in FIG. 11B, an insulating layer covering the gate insulating layer 120, the polysilicon electrodes 131 and 151, and the cap layer 142 is formed and etched back to form the spacer layer 122 on the side surfaces of the polysilicon electrodes 131 and 151 and the cap layer 142. Further, the gate insulating layer 121 separated for respective polysilicon electrodes 131 and 151 is formed.

Further, among the regions surrounded by the element isolation layer 111, the mask layer MK1 covering the region where the polysilicon electrode 131 is formed and having openings in the region where the polysilicon electrode 151 is formed is formed.

Thereafter, impurities are further injected into the region where the polysilicon electrode 151 is formed, and the impurities are diffused up to a predetermined depth of the substrate 110 by annealing or the like, and then the mask layer MK1 is removed. As a result, the diffusion region 113 is formed in the region in the element isolation layer 111 except directly under the polysilicon electrode 151.

Figure 11C:
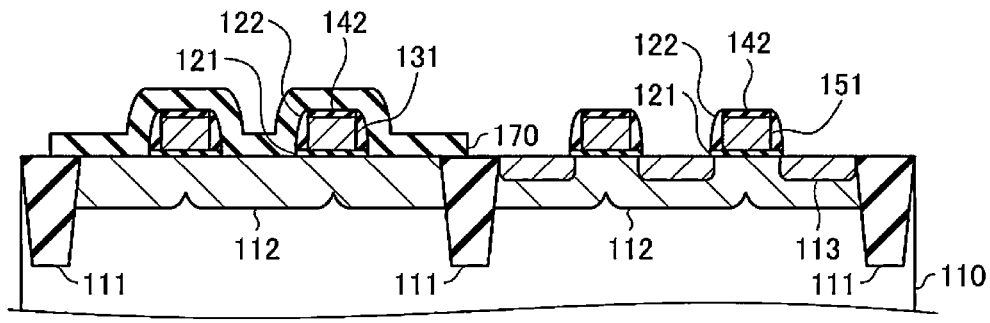

As shown in FIG. 11C, for example, the block layer 170 is formed on the entire surface of the substrate 110, the block layer 170 is removed from the region where the polysilicon electrode 151 is formed, and the block layer 170 covering the region where the polysilicon electrode 131 is formed is formed.

Figure 11D:
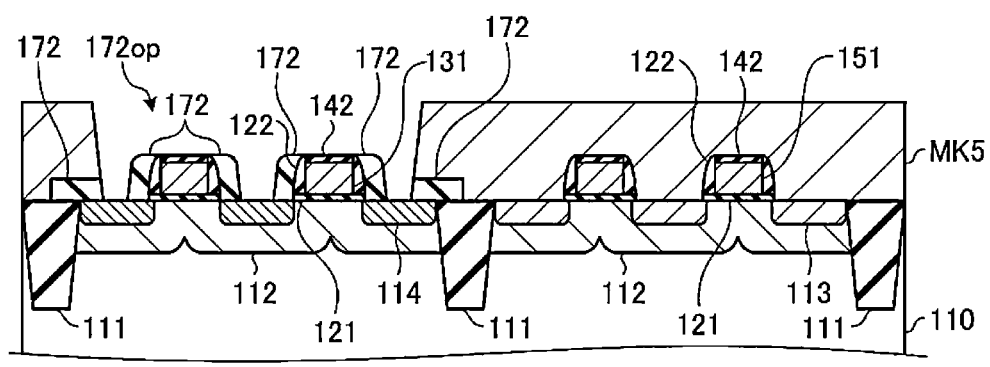

As shown in FIG. 11D, the mask layer MK5 having an opening in the region where the polysilicon electrode 131 is formed in the region surrounded by the element isolation layer 111, and the block layer 170 exposed from the opening of the mask layer MK5 is removed by etching to form the block layer 172 having the opening 172op in a predetermined region including a plurality of polysilicon electrodes 131.

Further, while the region where the polysilicon electrode 151 is formed is still covered with the mask layer MK5, impurities are injected into the diffusion region 112 of the substrate 110 exposed from the opening 172op of the block layer 172, and the impurities are diffused up to a predetermined depth of the substrate 110 by annealing or the like. At this time, the cap layer 142 on the upper surface of the polysilicon electrode 131 prevents the impurities from being injected into the polysilicon electrode 131.

As a result, the diffusion region 114 self-aligned with respect to the opening 172op of the block layer 172 is formed while maintaining a predetermined distance from the polysilicon electrode 131. Thereafter, the mask layer MK5 is removed.

Figure 12A:
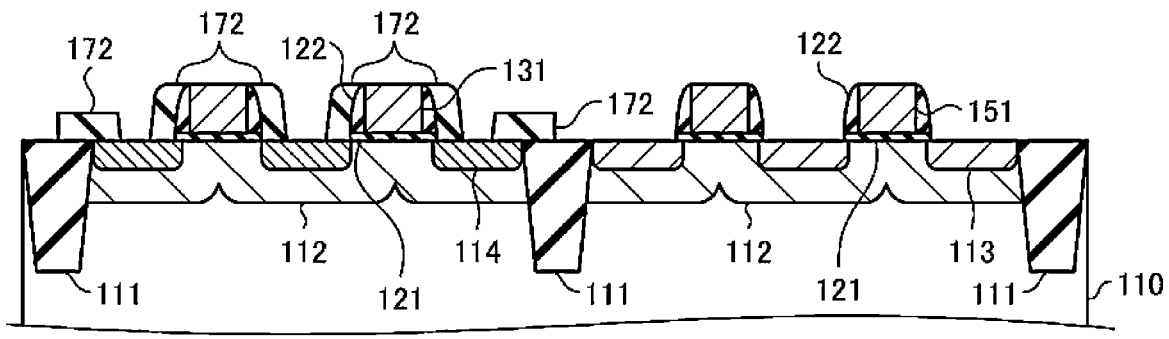
FIGS. 12A to 12C are diagrams illustrating a part of the procedure of the method for manufacturing the semiconductor device according to the second modification of the first embodiment in order.

As shown in FIG. 12A, the cap layer 142 on the polysilicon electrodes 131 and 151 is removed by etching.

Figure 12B:
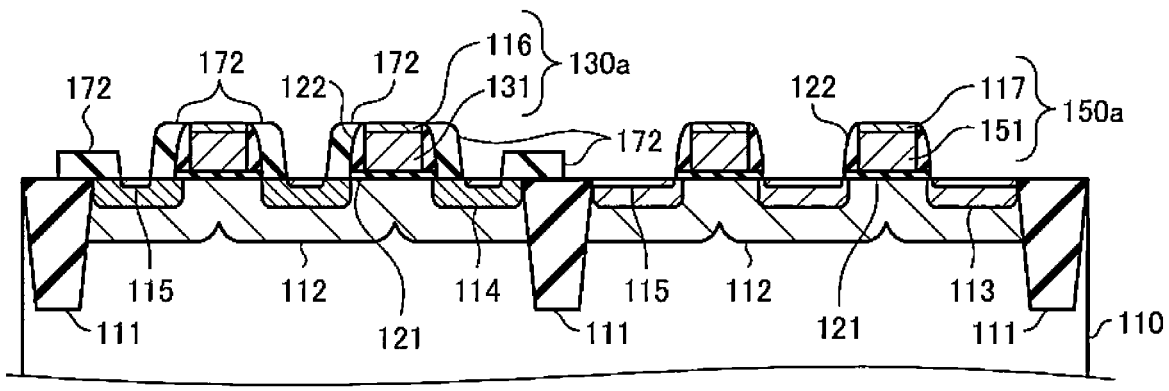

As shown in FIG. 12B, in the region where the polysilicon electrode 131 is formed, the surface of the diffusion region 114 of the substrate 110 exposed from the opening 172op of the block layer 172 is silicidized, and the silicide layer 115 is formed in a self-aligned manner with respect to the diffusion region 114 and the opening 172op of the block layer 172.

Further, in the region where the polysilicon electrode 151 is formed, the silicide layer 115 is formed in the portion of the diffusion region 113 exposed from the gate insulating layer 121 of a lower layer of the polysilicon electrode 151 and the spacer layer 122.

At this time, the upper surfaces of the polysilicon electrodes 131 and 151 exposed by removing the cap layer 142 are also silicidized and the SALICIDE layers 116 and 117 are formed, respectively. As a result, the gate electrode 130a having the polysilicon electrode 131 and the SALICIDE layer 116 and the gate electrode 150a having the polysilicon electrode 151 and the SALICIDE layer 117 are formed.

The SALICIDE layers 116 and 117 formed as described above have an unclear interface with the polysilicon layer, which is a material of the polysilicon electrodes 131 and 151, as compared with the silicide layer, which is a material of the metal electrodes 132 and 152 of the above-described first embodiment, which are formed by, for example, a CVD method or the like, and the surface roughness tends to be high due to inferior morphology.

However, since the SALICIDE layers 116 and 117 are self-aligned on the polysilicon electrodes 131 and 151, the SALICIDE layers 116 and 117 are suitable for forming a finer gate structure.

Figure 12C:
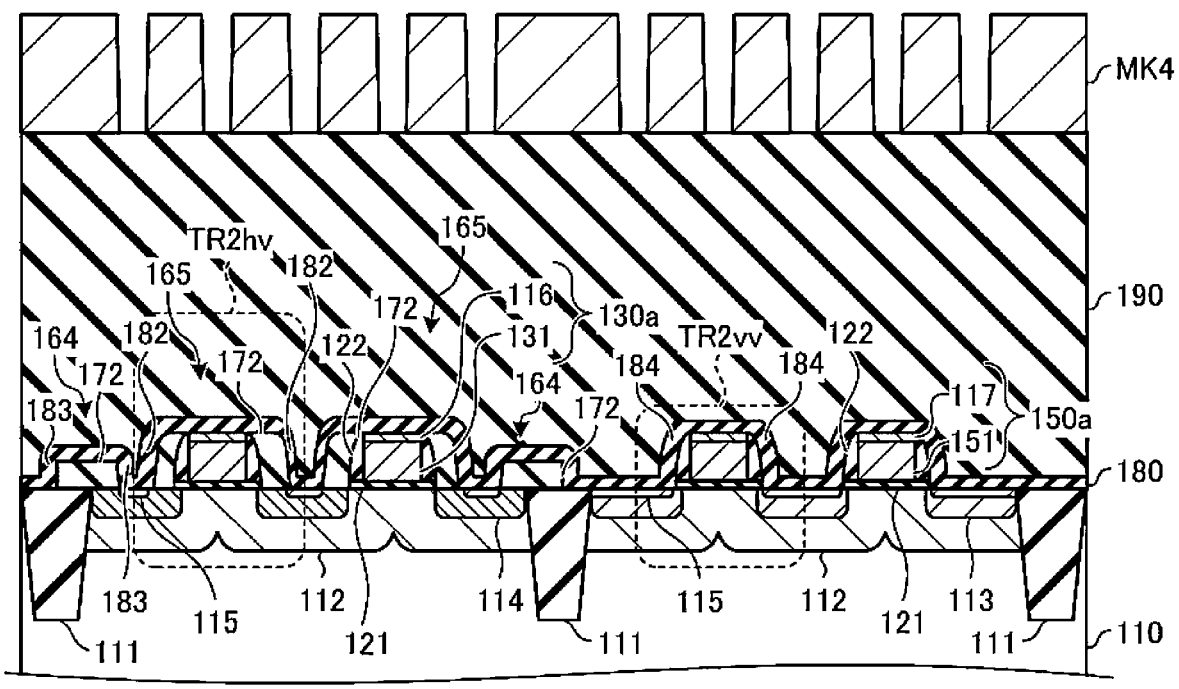

As shown in FIG. 12C, for example, the liner layer 180 that covers the entire surface of the substrate 110 is formed. As a result, transistors TR2hv having sidewalls 182 are formed on both sides of the gate electrode 130a in the X direction via the spacer layer 122 and the block layer 172. Further, transistors TR2vv having sidewalls 184 on both sides of the gate electrode 150a in the X direction are formed.

Further, for example, the interlayer insulating layer 190 that covers the entire surface of the substrate 110 is formed. Further, the mask layer MK4 having openings on the gate electrodes 130a and 150a and at predetermined positions on both sides of the gate electrodes 130a and 150a in the X direction is formed.

Thereafter, a plurality of holes penetrating the interlayer insulating layer 190, the liner layer 180, and the like are formed, and tungsten or the like is filled in the holes HL to form contacts CShv, CGhv, CSvv, and CGvv.

From the above, the semiconductor device 102 of the second modification is manufactured.

According to the semiconductor device 102 of the second modification, the same effect as that of the above-described first embodiment is obtained.

Second Embodiment

Hereinafter, the second embodiment will be described in detail with reference to the drawings. The semiconductor device of the second embodiment is different from the above-described first embodiment in that a dummy electrode is used to align the high-concentration diffusion region and the silicide layer on the diffusion region.

(Configuration of Semiconductor Device)

Figure 13A:
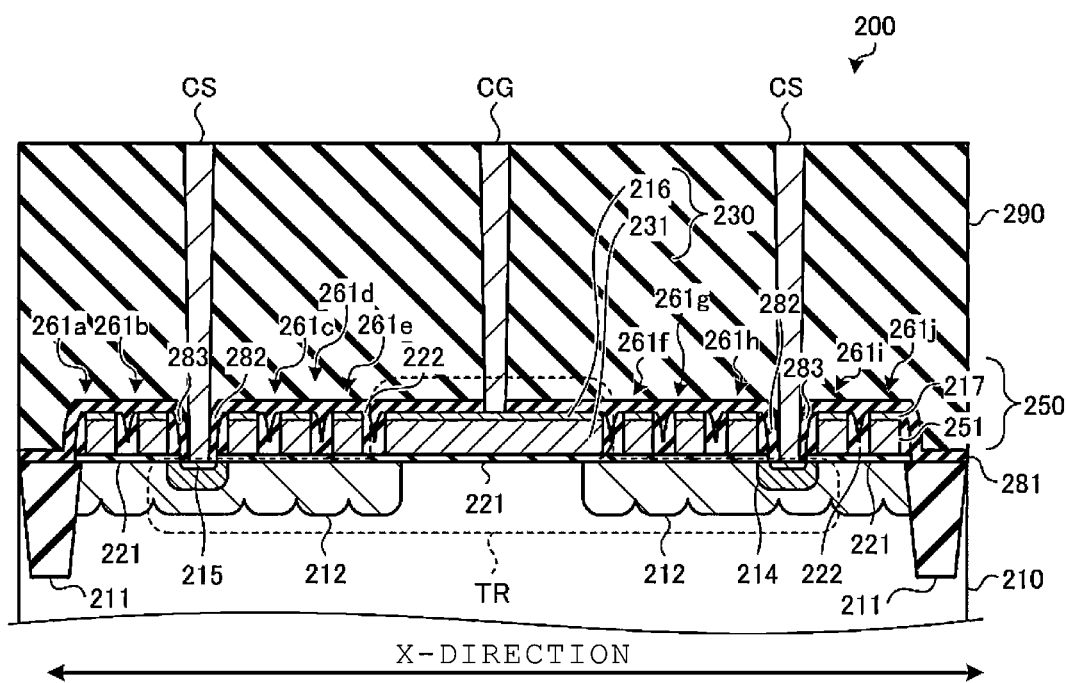
FIGS. 13A and 13B are diagrams showing an example of a configuration of a semiconductor device according to a second embodiment.
Figure 13B:
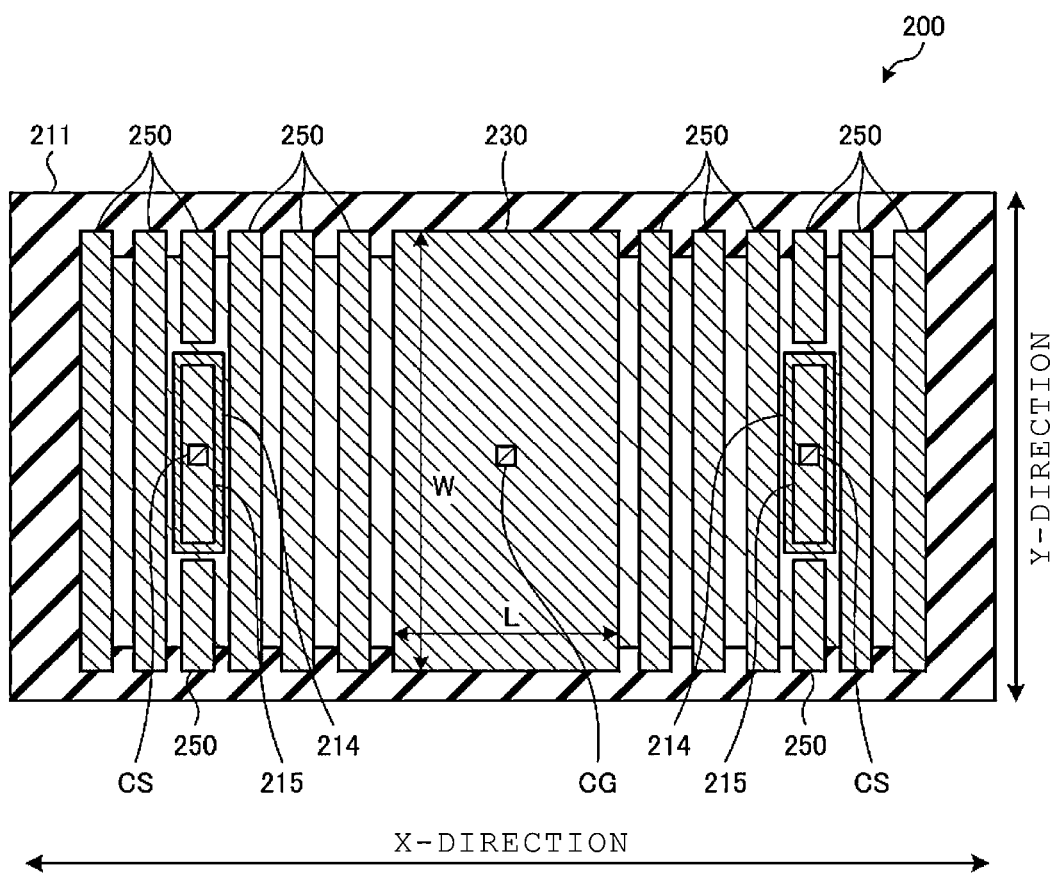

FIGS. 13A and 13B are diagrams showing an example of the configuration of a semiconductor device 200 according to the second embodiment. FIG. 13A is a cross-sectional view of the semiconductor device 200 along the X direction and FIG. 13B is a schematic top view showing the layout of the semiconductor device 200. In FIG. 13B, an element isolation layer 211, diffusion regions 212 and 214, a silicide layer 215, a gate electrode 230, and a dummy electrode 250 are mainly shown, and other configurations are omitted.

Also in the semiconductor device 200 of the second embodiment, the direction along the X direction may be referred to as the first direction, and the direction along the Y direction may be referred to as the second direction.

As shown in FIGS. 1A and 1B, the semiconductor device 100 includes a substrate 210, a transistor TR, the dummy electrode 250, an interlayer insulating layer 290, and contacts CS and CG. The transistor TR includes a diffusion region 212, a gate insulating layer 221, the gate electrode 230, and a liner layer 281. The transistor TR may include the diffusion region 214 and the silicide layer 215.

The substrate 210 is a semiconductor substrate such as a silicon substrate. The substrate 210 is provided with the element isolation layer 211 that electrically separates the region where the transistor TR is formed. Diffusion regions 212 and 214 and the silicide layer 215 are provided in the region of the substrate 210 separated by the element isolation layer 211 and on which the transistor TR is formed.

The diffusion region 212 as a first region is a region in which a predetermined conductive type impurity of P-type or N-type is diffused to the substrate 210 at a predetermined concentration, and includes the upper surface of the substrate 210. The diffusion region 212 extends over substantially the entire region separated by the element isolation layer 211, except for the region directly under the gate electrode 230 of the transistor TR. However, the diffusion region 212 may slightly wrap around the lower surface side of the gate electrode 230 at both end portions in the X direction.

The diffusion region 214 as the second region is a diffusion region provided in the diffusion region 212 including the upper surface of the substrate 210, and in which the same conductive type impurities as the diffusion region 212 are diffused to the substrate 210 at a high concentration as compared with the diffusion region 212. For example, a pair of diffusion regions 214 are provided in the diffusion region 212. A predetermined distance is allocated between each diffusion region 214 and the element isolation layer 211 in the X direction and the Y direction.

The silicide layer 215 includes the upper surface of the substrate 210 provided with the diffusion region 114. The silicide layer 215 is, for example, a tungsten silicide layer, a nickel silicide layer, a nickel platinum silicide layer, or the like.

Here, the center position of the silicide layer 215 in the direction along the X direction substantially coincides with the respective center positions of the diffusion regions 214 in the direction along the X direction. Such a relationship between the silicide layer 215 and the diffusion region 214 is also established in the Y direction. That is, the center position of the silicide layer 215 in the direction along the Y direction substantially coincides with the respective center positions of the diffusion regions 214 in the direction along the Y direction.

As a result, the silicide layer 215 fits in the diffusion region 214 without deviating from the diffusion region 214 and is surrounded by the diffusion region 214 having a predetermined width.

In the region separated by the element isolation layer 211, the gate electrode 230 extending in the direction along the Y direction is provided between the diffusion regions 214 located in the X direction. The gate electrode 230 projects onto the element isolation layer 211 in the Y direction. As described above, the diffusion region 112 is not provided directly under the gate electrode 230, except for both end portions of the gate electrode 230 in the X direction.

The gate electrode 230 has a polygate structure including, for example, a polysilicon electrode 231 and a SALICIDE layer 216 provided on the polysilicon electrode 231. That is, the polysilicon electrode 231 is, for example, a conductive polysilicon layer or the like and functions as a polygate. The SALICIDE layer 216 is, for example, a layer in which the upper surface of the polysilicon electrode 231 is silicidized, and is made of the same material as the above-mentioned silicide layer 215.

Here, the length of the gate electrode 230 in the direction along the Y direction, which is the stretching direction of the gate electrode 230, is a gate width W. Further, the length of the gate electrode 230 in the direction along the X direction intersecting the stretching direction of the gate electrode 230 is the gate length L.

The gate insulating layer 221 is provided in a lower layer of the gate electrode 230. The gate insulating layer 221 is, for example, a silicon oxide layer, a hafnium oxide layer, a zirconium oxide layer, or the like. The gate insulating layer 221 of the gate electrode 230 is shared by, for example, a dummy electrode 250 adjacent to the gate electrode 230 in the X direction.

A spacer layer 222 is provided on the side surface of the gate electrode 230. The spacer layer 222 is an insulating layer such as a silicon oxide layer. The spacer layer 222 of the gate electrode 230 is connected to, for example, the spacer layer 222 of the dummy electrode 250 adjacent to the gate electrode 230 in the X direction.

In the region separated by the element isolation layer 211, a plurality of dummy electrodes 250 extending in the direction along the Y direction are provided at positions separated from each other in the X direction, except for regions provided with diffusion regions 114 on both sides of the gate electrode 230 in the X direction.

The width of each dummy electrode 250 in the direction along the X direction can be, for example, about several tens of nm. Further, the pitch between the plurality of dummy electrodes 250 in the direction along the X direction is preferably equal to or greater than the width of each dummy electrode 250 in the direction along the X direction, except for the vicinity of the diffusion region 214, and can be, for example, about twice the width of the dummy electrodes 250 in the direction along the X direction.

The dummy electrode 250 projects onto the element isolation layer 211 in the Y direction. The dummy electrodes 250 are provided on both sides of the diffusion region 214 in the Y direction at positions overlapping the diffusion region 214 in the X direction.

The dummy electrode 250 has a layered structure similar to that of the gate electrode 230 and is a dummy structure having no effective function. That is, the dummy electrode 250 includes, for example, a polysilicon layer 251 made of the same material as the polysilicon electrode 231 and a SALICIDE layer 217 provided on the polysilicon layer 251 and made of the same material as the SALICIDE layer 216.

A spacer layer 222 is provided on the side surface of the dummy electrode 250 as in the gate electrode 230. The spacer layer 222 on the side surface of the dummy electrode 250 is connected to the gate electrode 230 adjacent in the X direction or the spacer layer 222 of another dummy electrode 250.

Further, the plurality of dummy electrodes 250 share the gate electrode 230 and the gate insulating layer 221 as described above. That is, the gate insulating layer 221 covers substantially the entire surface of the region separated by the element isolation layer 211 except on the diffusion region 214.

Here, the center position in the direction along the X direction between the dummy electrodes 250 adjacent to each other in the X direction across the diffusion region 214 and the center position in the direction along the X direction of the diffusion region 214 substantially coincide with each other. Therefore, the center position between the dummy electrodes 250 in the direction along the X direction and the center position of the silicide layer 215 provided in the diffusion region 214 in the direction along the X direction substantially coincide with each other.

Further, the relationship between the dummy electrode 250, and the diffusion region 214 and the silicide layer 215 as described above is also established in the Y direction. That is, the center position in the direction along the Y direction between the dummy electrodes 250 facing in the Y direction across the diffusion region 214 substantially coincides with the center position of the diffusion region 214 in the direction along the Y direction and the center position of the silicide layer 215 in the direction along the Y direction.

The liner layer 281 such as a silicon nitride layer is provided on substantially the entire surface of the substrate 210. The liner layer 281 covers substantially the whole of the diffusion regions 212 and 214 excluding the connection portion of the contact CS, the gate insulating layer 221, the upper surface of the gate electrode 230 excluding the connection portion of the contact CG, the upper surface of the dummy electrode 250, and the spacer layer 222.

Among the plurality of dummy electrodes 250, the side surfaces of some dummy electrodes 250 are covered with the liner layer 281 via the spacer layer 222 even on one side in the X direction.

Here, the configuration including the gate insulating layer 221, the dummy electrode 250, the spacer layer 222, and the liner layer 281 may be referred to as a stacked body 261. In the following description, the stacked bodies 261 including the dummy electrodes 250 located in the direction along the X direction are referred to as stacked bodies 261a to 261j in order from the left side of the paper surface in FIG. 13A.

That is, the stacked body 261a is the stacked body 261 closest to the left side of the paper surface, and the stacked body 261j is the stacked body 261 closest to the right side of the paper surface. Further, a diffusion region 214 and a silicide layer 215 are provided between the stacked bodies 261b and 261c located in the X direction and between the stacked bodies 261h and 261i located in the X direction, respectively.

Therefore, the spacer layers 222 of the stacked bodies 261b and 261c are not connected on the side facing each other, and the liner layer 281 is provided on the side surfaces of the stacked bodies 261b and 261c on the side facing each other via the spacer layer 222.

As a result, the stacked body 261b as the second structure includes a gate insulating layer 221, a dummy electrode 250, and a sidewall 283 as a second sidewall covering the side surface of the spacer layer 222 on one side in the X direction.

Further, the stacked body 261c as the first structure includes a gate insulating layer 221, a dummy electrode 250, and a sidewall 282 as a first sidewall covering the side surface of the spacer layer 222 on one side in the X direction.

Similarly, the spacer layers 222 of the stacked bodies 261h and 261i are not connected to each other on the side facing each other, and the liner layer 281 is provided on the side surfaces of the stacked bodies 261h and 261i facing each other via the spacer layer 222.

As a result, the stacked body 261h as a first structure includes a gate insulating layer 221, a dummy electrode 250, and a sidewall 282 as a first sidewall covering the side surface of the spacer layer 222 on one side in the X direction.

Further, the stacked body 261i as a second structure includes a gate insulating layer 221, a dummy electrode 250, and a sidewall 283 as a second sidewall covering the side surface of the spacer layer 222 on one side in the X direction.

Further, between the stacked bodies 261b and 261c, on both sides in the Y direction in which the diffusion region 214 and the silicide layer 215 are not provided, other stacked bodies 261 face each other in the Y direction. Further, between the stacked bodies 261h and 261i, on both sides in the Y direction in which the diffusion region 214 and the silicide layer 215 are not provided, other stacked bodies 261 face each other in the Y direction.

The interlayer insulating layer 290 such as a silicon oxide layer is provided in the liner layer 281. The interlayer insulating layer 290 covers substantially the whole of the diffusion regions 212 and 214, the gate insulating layer 221, the gate electrode 230, the dummy electrode 250, and the spacer layer 222 via the liner layer 281.

A contact CG as a second contact that penetrates the interlayer insulating layer 290 and the liner layer 281 and applies a gate voltage to the gate electrode 230 is connected to the upper surface of the gate electrode 230 of the transistor TR.

A contact CS as a first contact that penetrates the interlayer insulating layer 290 and the liner layer 281 and applies a high voltage to the source and drain of the transistor TR is connected to the silicide layer 215 provided on the diffusion regions 214 on both sides of the gate electrode 230 in the X direction.

These contacts CG and CS are mainly composed of a metal such as tungsten, as in the case of the contacts CGhv and CShv of the first embodiment described above.

As described above, the transistor TR provided in the vicinity of the diffusion region 214 containing high-concentration impurities and to which a high voltage is applied is configured as, for example, an HV-MOS transistor, a high breakdown voltage MOS transistor or the like.

Here, the contact CS passes between the respective sidewalls 282 and 283 of the dummy electrodes 250 located on both sides in the X direction and is connected to the silicide layer 215. At this time, the contact CS is in contact with at least one of the sidewalls 282 and 283 on both sides in the X direction on the side surface. In the example of FIG. 13A, the contact CS is in contact with both sidewalls 282 and 283.

As described above, the diffusion region 214 and the silicide layer 215 to which a high voltage is applied by the contact CS maintain a predetermined distance from the element isolation layer 211 in the X direction and the Y direction. Further, the silicide layer 215 is surrounded by the diffusion region 214 having a predetermined width. As a result, the breakdown voltage of the transistor TR is maintained.

(Method for Manufacturing Semiconductor Device)

Next, the method for manufacturing the semiconductor device 200 of the second embodiment will be described with reference to FIGS. 14A to 17. FIGS. 14A to 16B are diagrams illustrating a part of the procedure of the method for manufacturing the semiconductor device 200 according to the second embodiment in order. More specifically, FIGS. 14A to 16B show a cross section of the semiconductor device 200 in the manufacturing process along the X direction.

Figure 14A:
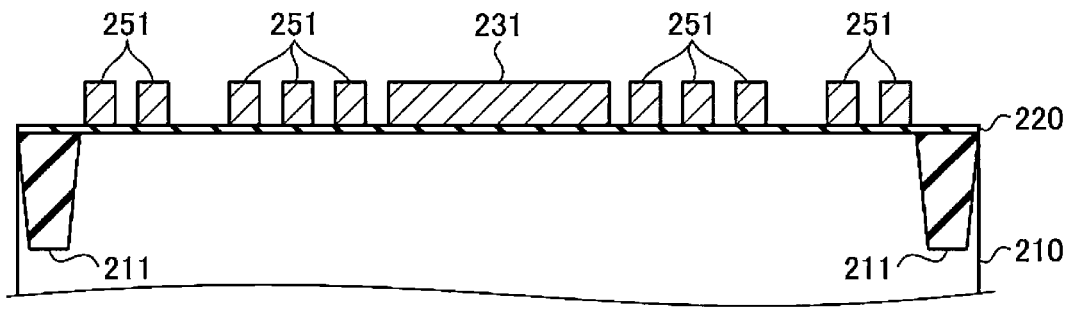
FIGS. 14A to 14D are diagrams illustrating a part of a procedure of a method for manufacturing the semiconductor device according to the second embodiment in order.

As shown in FIG. 14A, the element isolation layer 211 is formed on a substrate 210 such as a silicon substrate. Further, a gate insulating layer 220 is formed on the entire upper surface of the substrate 210.

Further, the polysilicon electrode 231 and the polysilicon layer 251 are formed on the gate insulating layer 220 in the region surrounded by the element isolation layer 211. The polysilicon electrode 231 and the polysilicon layer 251 are formed, for example, by forming a conductive polysilicon layer on the gate insulating layer 220 by a CVD method or the like, and etching and molding the polysilicon layer into the shapes of the gate electrode 230 and the dummy electrode 250.

At this time, the polysilicon layer 251 is not located in the region where the diffusion region 214 is formed. As a result, a region where the gate insulating layer 221 is exposed larger than the others is provided in a predetermined region on both sides of the polysilicon electrode 231 in the X direction.

Further, as described above, the width of each polysilicon layer 251 in the direction along the X direction can be, for example, about several tens of nm. Further, the pitch between these polysilicon layers 251 in the direction along the X direction can be, for example, about twice the width of the polysilicon layer 251 in the direction along the X direction, except for the vicinity of the above-mentioned region exposed larger than the others.

Figure 14B:
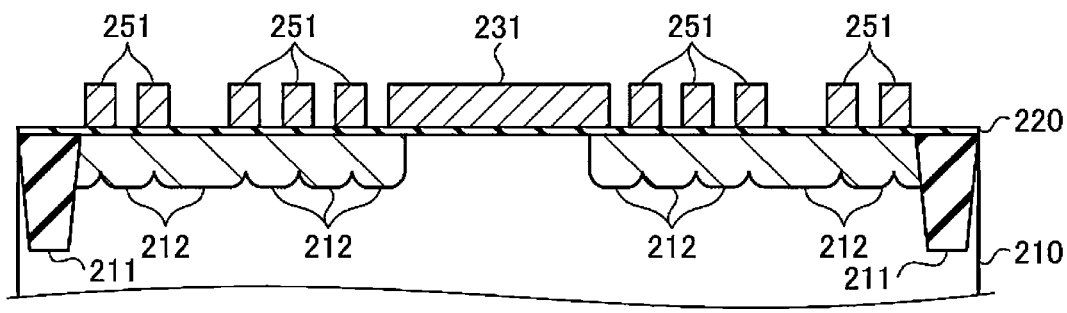

As shown in FIG. 14B, in a region surrounded by the element isolation layer 211, impurities are injected through the gate insulating layer 220 into a region in which a plurality of polysilicon layers 251 are formed on both sides of the polysilicon electrode 231 in the X direction and the impurities are diffused up to a predetermined depth of the substrate 210 by annealing or the like to form the diffusion region 212.

At this time, since the impurities are injected into the region deviated from the polysilicon electrode 231 as a target, the injection of the impurities into the polysilicon electrode 231 is prevented and the diffusion of the impurities directly under the polysilicon electrode 231 is prevented. However, some impurities may wrap around to the lower surface side of the polysilicon electrode 231 near the end portion of the polysilicon electrode 231.

Further, the polysilicon layer 251 hinders the injection of impurities directly under the polysilicon layer 251. However, since the width of the polysilicon layer 251 in the X direction is sufficiently narrow, the impurities can also be diffused to the lower surface side of the polysilicon layer 251. In other words, the width of the polysilicon layer 251 in the direction along the X direction is adjusted so that the injected impurities can sufficiently wrap around directly under the polysilicon layer 251.

Although impurities are directly injected into the polysilicon layer 251, the polysilicon layer 251 is a part of the dummy electrode 250 and does not have an effective function in the semiconductor device 200, which does not affect the electrical characteristics and the like.

Figure 14C:
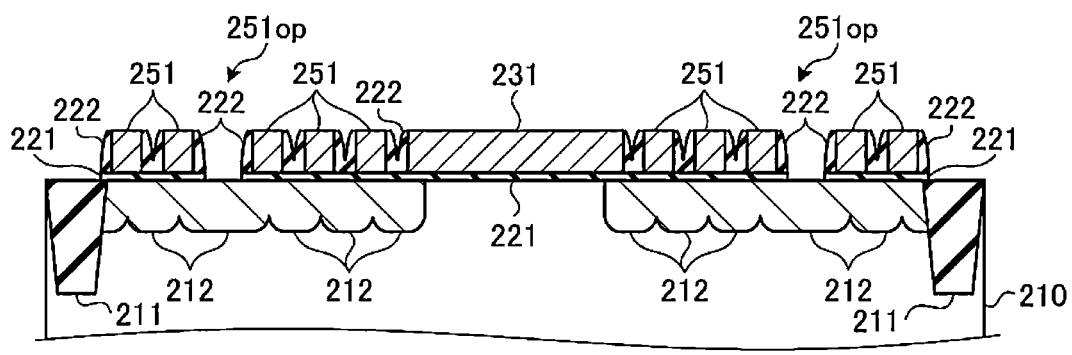

As shown in FIG. 14C, the spacer layer 222 is formed on the side surfaces of the polysilicon electrode 231 and the polysilicon layer 251. At this time, the spacer layer 222 of the polysilicon layer 251 adjacent to the polysilicon electrode 231 in the X direction and the spacer layer 222 of the polysilicon electrode 231 are connected to each other. Further, except for the polysilicon layer 251 in the vicinity of the region exposed larger than the others described above, the spacer layers 222 of the other polysilicon layers 251 are connected to each other.

In other words, the pitches of the plurality of polysilicon layers 251 are adjusted so that the spacer layers 222 are connected to each other.

Further, the gate insulating layer 220 of the portion not covered with the polysilicon electrode 231, the polysilicon layer 251, and the spacer layer 222 is removed by etching, and the gate insulating layer 221 is formed at the position overlapping the polysilicon electrode 231, the polysilicon layer 251, and the spacer layer 222.

As a result, the plurality of polysilicon layers 251 have a structure in which the spacer layers 222 and the gate insulating layer 221 are connected to each other. Further, an opening 251op in which the surface of the substrate 210 is exposed is formed in a region which is exposed larger than the others and in which the spacer layer 222 and the gate insulating layer 221 are not connected to each other.

Figure 14D:
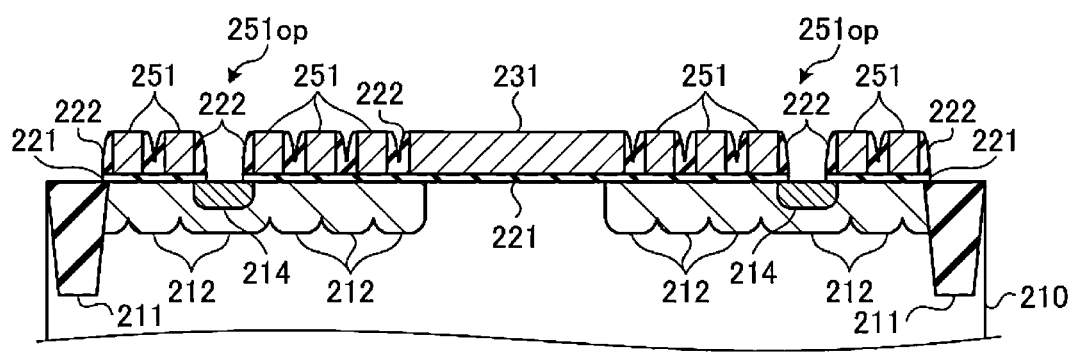

As shown in FIG. 14D, impurities are further injected into both sides of the polysilicon electrode 231 in the X direction in the region surrounded by the element isolation layer 211.

On both sides of the polysilicon electrode 231 in the X direction, the plurality of polysilicon layers 251 are connected by spacer layers 222 facing each other in the X direction, except for the vicinity of the above-mentioned opening 251op, and the gate insulating layer 221 is continuously provided in the lower layer of these polysilicon layers 251.

Therefore, impurities are mainly injected into the openings 251op on both sides of the polysilicon electrode 231 in the X direction, which are not covered with the polysilicon layer 251, the spacer layer 222, and the gate insulating layer 221.

At this time, since the impurities are injected into the region separated from the polysilicon electrode 231 in the X direction as a target, the injection of the impurities into the polysilicon electrode 231 is prevented. Further, since the target is a very limited region between the plurality of polysilicon layers 251 located in the X direction, the injection of impurities directly under the polysilicon layer 251 is prevented. Impurities are injected into the polysilicon layer 251, but as described above, there is no problem because the polysilicon layer 251 is a part of the dummy electrode 250.

After injecting impurities, the impurities are diffused up to a predetermined depth of the substrate 210 by annealing or the like. At this time, some impurities may wrap around to the lower surface side of the polysilicon layer 251 adjacent to the opening 251*op*. As a result, the diffusion region 214 in which high-concentration impurities are diffused is formed.

As described above, the diffusion region 214 is self-aligned with respect to the opening 251*op* with the polysilicon layer 251 located around the diffusion region 214, the gate insulating layer 221 of the lower layer of the polysilicon layer 251, and the spacer layer 222 on the side surface of the polysilicon layer 251 as masks. The wraparound distance of impurities from the opening 251*op* to the lower surface side of the polysilicon layer 251 is also substantially equal on both sides in the X direction and the Y direction.

Therefore, as described above, the center positions between the polysilicon layers 251 on both sides of the opening 251*op* in the X direction and the Y direction and the center positions of the diffusion region 214 in the X direction and the Y direction substantially coincide with each other.

As shown in FIG. 14A, the surface of the diffusion region 214 exposed from the opening 251*op* is silicidized, and the silicide layer 215 is formed in a self-aligned manner with respect to the diffusion region 214 and the opening 251*op*.

As described above, the silicide layer 215 is also formed by using the polysilicon layer 251 around the diffusion region 214 that becomes the mask for impurity injection, the gate insulating layer 221 of the lower layer thereof, and the spacer layer 222 on the side surface of the polysilicon layer 251 as masks.

Therefore, as described above, the center positions between the polysilicon layers 251 on both sides of the opening 251*op* in the X direction and the Y direction and the center positions of the silicide layer 215 in the X direction and the Y direction substantially coincide with each other. Further, the center positions of the silicide layer 215 in the X direction and the Y direction substantially coincide with the center positions of the diffusion region 214 in the X direction and the Y direction.

Further, in the above, the upper surfaces of the polysilicon electrode 231 and the polysilicon layer 251 are also silicidized to form the SALICIDE layers 216 and 217, respectively. As a result, the gate electrode 230 including the polysilicon electrode 231 and the SALICIDE layer 216, and the dummy electrode 250 including the polysilicon layer 251 and the SALICIDE layer 217 are formed.

As described above, the gate electrode 230 and the dummy electrode 250 both have the same layered structure by the above processing.

Figure 15A:
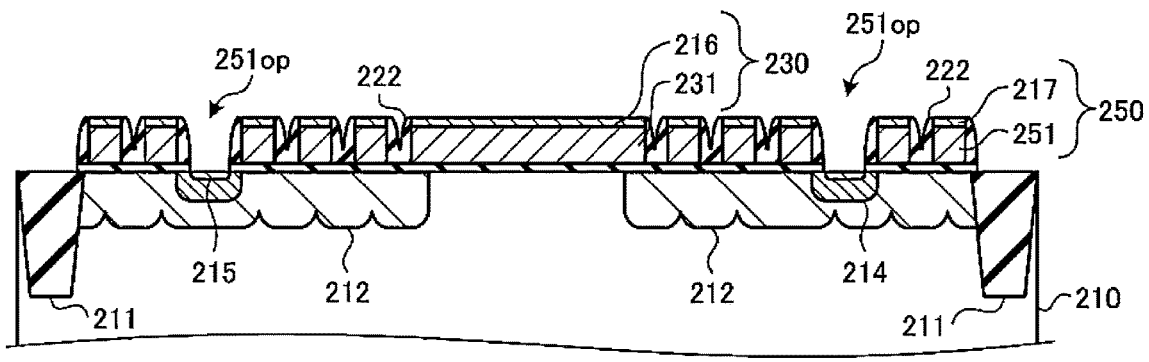
FIGS. 15A to 15C are diagrams illustrating a part of the procedure of the method for manufacturing the semiconductor device according to the second embodiment in order.
Figure 15B:
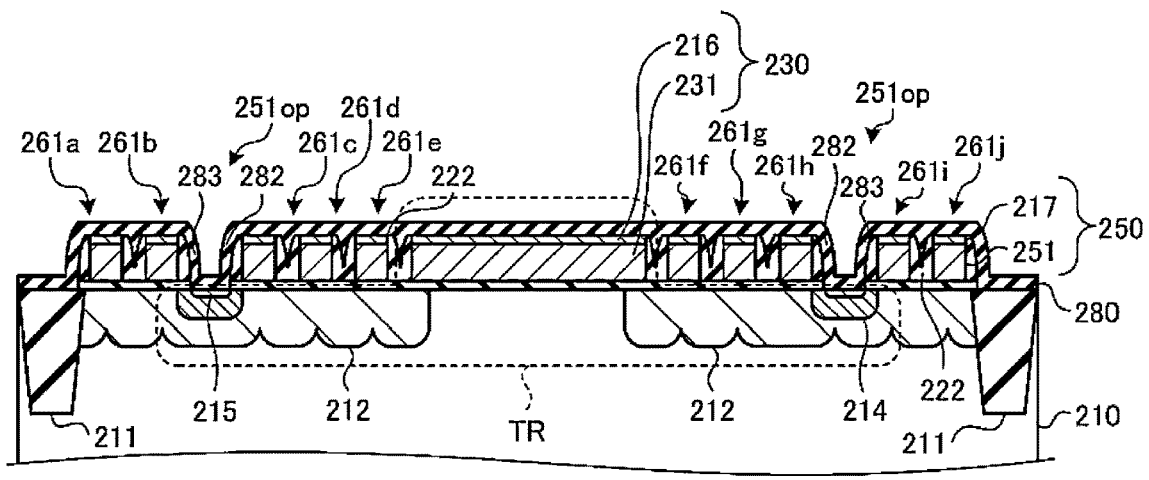

As shown in FIG. 15B, for example, the liner layer 280 covering the entire surface of the substrate 210 is formed.

As a result, the gate insulating layer 221, the gate electrode 230, and the spacer layer 222 are covered with the liner layer 280, and the transistor TR is formed.

Further, the gate insulating layer 221, the dummy electrode 250, and the spacer layer 222 are covered with the liner layer 280, and the stacked bodies 261*a* to 261*j* are formed. At this time, sidewalls 282 are formed on the side surfaces of the stacked bodies 261*c* and 261*h* adjacent to the diffusion regions 214 on both sides in the X direction of the polysilicon electrode 231 on the diffusion region 214 side, and sidewalls 283 are formed on the side surface on the diffusion region 214 side of the stacked bodies 261*b* and 261*i*.

Figure 15C:
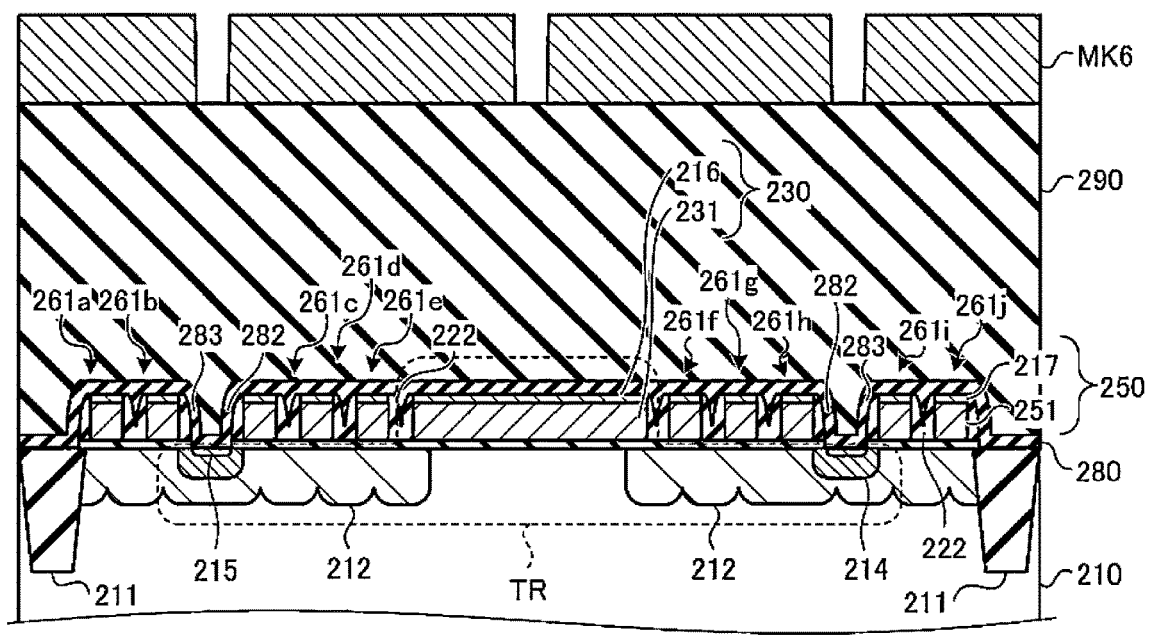

As shown in FIG. 15C, for example, the interlayer insulating layer 290 that covers the entire surface of the substrate 210 is formed. Further, a mask layer MK6 having openings on the gate electrode 230 and at predetermined positions on both sides of the gate electrode 230 in the X direction is formed.

Figure 16A:
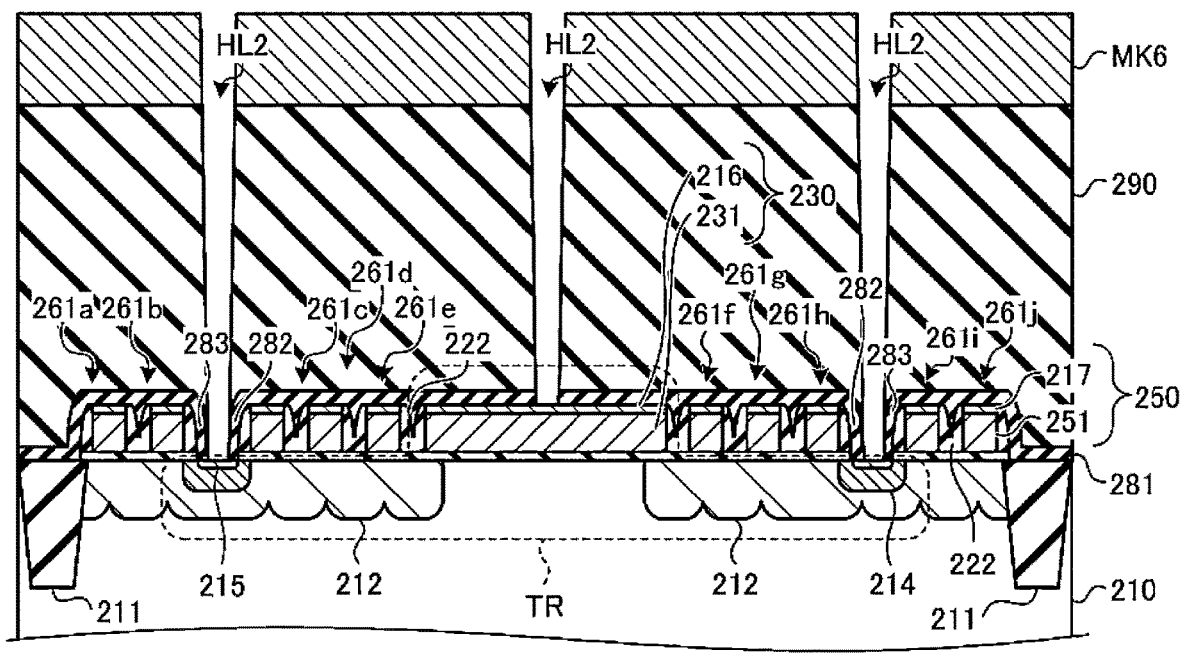
FIGS. 16A and 16B are diagrams illustrating a part of the procedure of the method for manufacturing the semiconductor device according to the second embodiment in order.

As shown in FIG. 16A, the interlayer insulating layer 290 of the portion exposed from the mask layer MK6 is penetrated by etching, and the liner layer 280 of the lower layer thereof is further penetrated to form a plurality of holes HL2 reaching the upper surface of the gate electrode 230 or the silicide layer 215 on the diffusion region 214. As a result, the liner layer 281 through which the plurality of holes HL2 penetrate is formed.

At this time, the hole HL between the dummy electrodes 250 located across the diffusion region 214 in the X direction contacts at least one of the sidewalls 282 and 283 formed on the side surfaces of the stacked bodies 261*b* and 261*c* or the stacked bodies 261*h* and 261*i* located on both sides in the X direction, respectively, on the side surface, and passes between the sidewalls 282, 283 to reach the silicide layer 215.

Thereafter, the mask layer MK6 is removed.

Figure 16B:
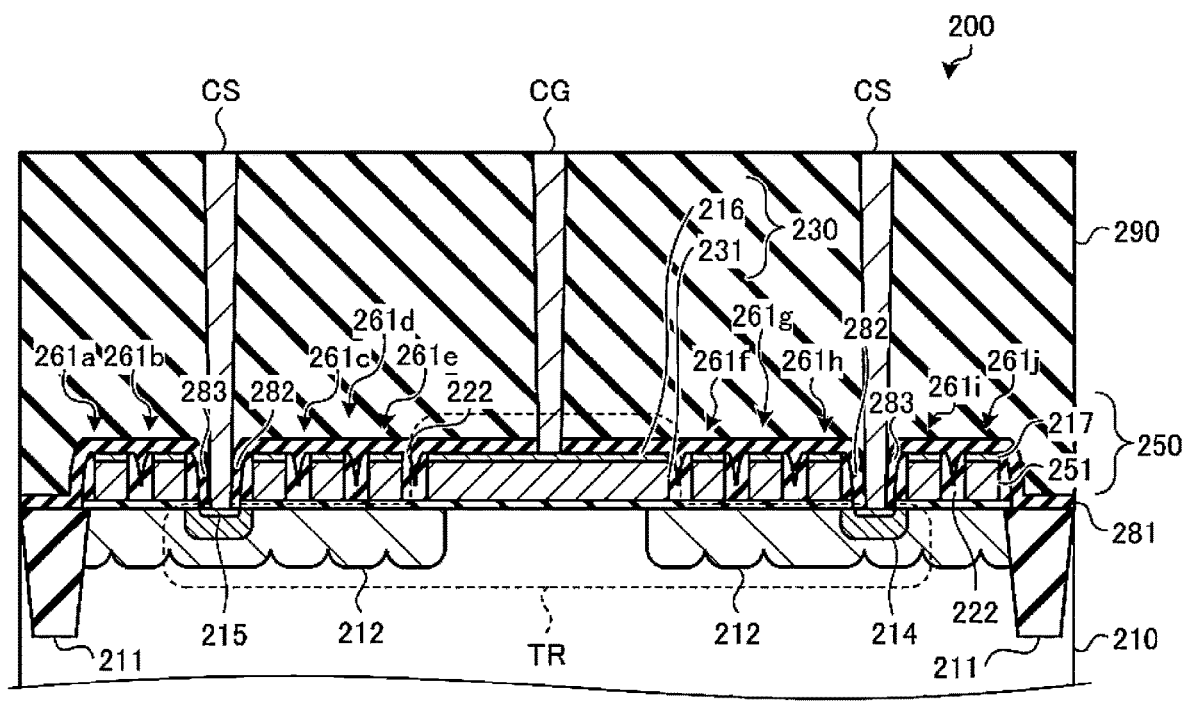

As shown in FIG. 16B, each hole HL2 is filled with tungsten or the like. As a result, a contact CG connected to the gate electrode 230 is formed. In addition, contacts CS connected to the silicide layers 215 formed in the diffusion regions 214 on both sides of the gate electrode 230 in the X direction are formed.

From the above, the semiconductor device 200 of the second embodiment is manufactured.

Even in the semiconductor device 200 of the second embodiment, the misalignment of the contact CS may occur. However, as in the case of the semiconductor device 100 of the first embodiment described above, the contact CS of the semiconductor device 200 is also self-aligned with the silicide layer 215. An example thereof is shown in FIG. 17.

Figure 17:
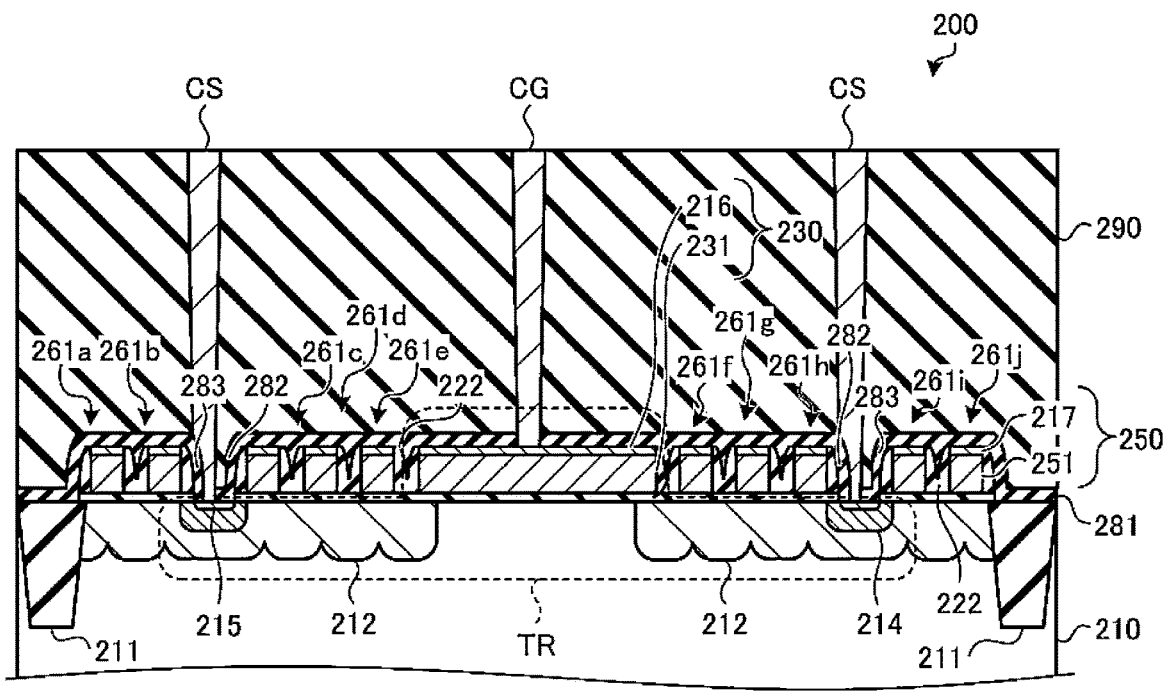
FIG. 17 is a diagram showing an example of a case where the contacts of the semiconductor device according to the second embodiment are formed in a misaligned state.

FIG. 17 is a diagram showing an example of a case where the contact CS of the semiconductor device 200 according to the second embodiment is formed in a misaligned state. More specifically, FIG. 17 shows a cross section of the semiconductor device 200 including the misaligned contact CS along the X direction, which corresponds to FIG. 13A described above.

As shown in FIG. 17, the contacts CS and CG connected to the transistor TR are shifted from the regular position according to the design to the left side of the paper surface, that is, to one side in the X direction due to, for example, the above-mentioned superposition deviation when forming the mask MK6.

Therefore, the contact CG is connected to the gate electrode 230 at a position shifted to the left side of the paper surface from the center position of the gate electrode 230 of the transistor TR in the X direction. Further, the contact CS is formed at a position shifted to the left side of the paper surface from the center position of the diffusion region 214 and the silicide layer 215 in the X direction. As a result, the contact CS is formed at a position where a part of the lower end portion deviates from the diffusion region 214 and the silicide layer 215.

However, the portions of the contact CS that are deviated from the diffusion region 214 and the silicide layer 215 are in contact with the sidewall 283 of the stacked body 261*b* on one side in the X direction or the sidewall 282 of the stacked body 261*h*, and as a result, the contact CS is terminated without reaching the upper surface of the substrate 210.

In this way, even when a part of the contact CS is formed at a position that is deviated from the diffusion region 214 and the silicide layer 215, the lower end portion of the contact CS is self-aligned with the diffusion region 214 and the silicide layer 215.

Summary

As described above, as semiconductor devices including transistors become smaller, it is difficult to perform alignment so that the silicide layer is surrounded by a high-concentration diffusion region having a predetermined width while the high-concentration diffusion region keeps a predetermined distance from the element isolation layer and the gate electrode in order to maintain the high breakdown voltage of the HV transistor.

For example, a silicide block layer such as a silicon oxide layer or a silicon oxynitride layer having an opening in a part of the high-concentration diffusion region may be used so that the silicide layer is formed in the high-concentration diffusion region when aligning the silicide layer with the high-concentration diffusion region.

However, it may be necessary to increase the size of the high-concentration diffusion region so that the opening of the silicide block layer is reliably aligned on the high-concentration diffusion region.

Specifically, the width of the silicide layer is preferably about twice the diameter of the contact connected to the silicide layer, for example. Further, in view of the alignment accuracy of the openings of the silicide block layer, a margin having a width similar to that of the silicide layer may be required on both sides from the position overlapping the silicide layer in the high-concentration diffusion region. Therefore, the miniaturization of the semiconductor device may be hindered.

According to the semiconductor device 200 of the second embodiment, the stacked bodies 261b and 261c including the dummy electrode 250 and the sidewalls 283 and 282 provided on the diffusion region 214 side of the dummy electrode 250, and the stacked bodies 261h and 261i including sidewalls 282 and 283 provided on the diffusion region 214 side of the dummy electrode 250 are provided on both sides of the diffusion region 214 in the X direction, respectively.

When forming the diffusion region 214, these dummy electrodes 250 are mainly used as masks for impurity injection, and the diffusion region 214 is formed in a self-aligned manner. Further, the same dummy electrode 250 is used as a mask when forming the silicide layer 215.

As a result, the alignment of the diffusion region 214 with respect to the element isolation layer 211 and the like and the alignment of the silicide layer 215 with respect to the diffusion region 214 can be unified, and the alignment accuracy thereof can be improved. Further, since the alignment margin of the opening of the silicide block layer is not required, in principle, the width of the diffusion region 214 in the direction along the X direction can be reduced to, for example, about ⅓.

According to the semiconductor device 200 of the second embodiment, the dummy electrode 250 has a layered structure similar to that of the gate electrode 230. Since the diffusion region 214 and the silicide layer 215 are formed by using such a dummy electrode 250 as a mask, the alignment accuracy of the diffusion region 214 and the silicide layer 215 can be improved without adding a process.

According to the semiconductor device 200 of the second embodiment, the contact CS is provided which passes between the sidewall 283 of the stacked body 261b and the sidewall 282 of the stacked body 261c and is electrically connected to the diffusion region 214. Further, the contact CS is provided which passes between the sidewall 282 of the stacked body 261h and the sidewall 283 of the stacked body 261i and is electrically connected to the diffusion region 214. As a result, the contact CS is self-aligned with respect to the diffusion region 214 and the silicide layer 215.

First Modification

In the above-described second embodiment, for example, the transistor TR has a polygate structure including a polysilicon electrode 231. However, the configuration of the second embodiment can also be applied to a transistor having a polymetal gate structure, for example. An example of the application of the above configuration to a transistor having the polymetal gate structure will be described below with reference to FIG. 18.

Figure 18:
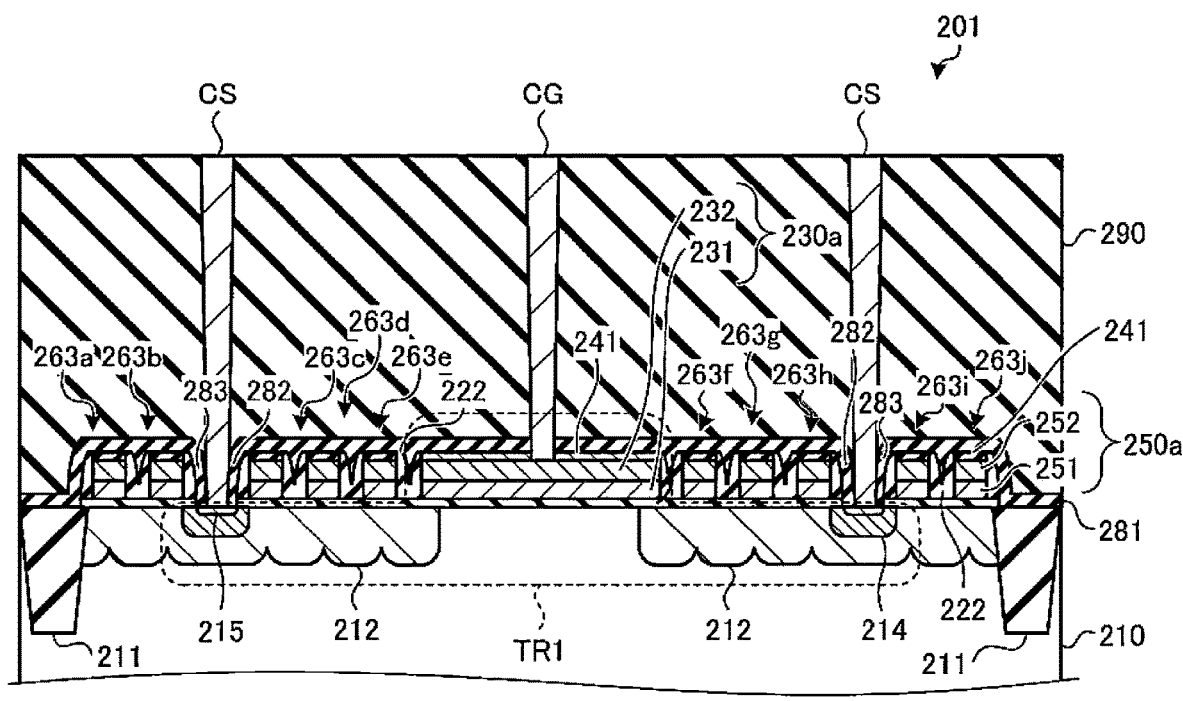
FIG. 18 is a diagram showing an example of a configuration of a semiconductor device according to a first modification of the second embodiment.

FIG. 18 is a diagram showing an example of a configuration of a semiconductor device 201 according to a first modification of the second embodiment. More specifically, FIG. 18 shows a cross section of the semiconductor device 201 along the X direction, which corresponds to FIG. 13A described above.

In the semiconductor device 201 of the first modification, the same components as those in the second embodiment are designated by the same reference numerals, and the description thereof will be omitted. Further, also in the semiconductor device 201 of the first modification, the direction along the X direction may be referred to as a first direction, and the direction along the Y direction may be referred to as a second direction.

As shown in FIG. 18, the transistor TR1 is provided in the region separated by the element isolation layer 211. The gate electrode 230a of the transistor TR1 extends in the direction along the Y direction, and diffusion regions 214 are provided on both sides of the gate electrode 230a in the X direction.

The gate electrode 230a has the polysilicon electrode 231 provided on the gate insulating layer 221 and the metal electrode 232 provided on the polysilicon electrode 231. The metal electrode 232 is a tungsten silicide layer or the like formed by a CVD method or the like. The metal electrode 232 has a better morphology than, for example, the SALICIDE layer 216 described above, has a flat film quality, and has a feature that the boundary with the polysilicon electrode 231 can be easily distinguished.

On both sides of the gate electrode 230a in the X direction, a plurality of dummy electrodes 250a that are separated from each other in the X direction and extend in the direction along the Y direction are provided. Similar to the gate electrode 230a, the dummy electrode 250a has a layered structure of the polysilicon layer 251 and the metal layer 252 on the polysilicon layer 251 and is a dummy structure having no effective function.

The gate electrode 230a and the dummy electrode 250a share the gate insulating layer 221 that continuously extends the lower layer of the gate electrode 230a and the dummy electrode 250a. Further, the cap layer 241 such as a silicon nitride layer is provided on the upper surface of each of the gate electrode 230a and the dummy electrode 250a.

The spacer layer 222 is formed on the side surfaces of the gate electrode 230a and the dummy electrode 250a. These spacer layers 222 are connected to the spacer layer 222 of the gate electrode 230a or the dummy electrode 250a adjacent in the X direction.

Further, the gate electrode 230a and the dummy electrode 250a are covered with the liner layer 281 on the upper surface thereof via the cap layer 241, and on the side surface thereof via the spacer layer 222.

As a result, the stacked bodies 263a to 263j including the gate insulating layer 221, the dummy electrode 250a, the spacer layer 222, and the liner layer 281 are located on the substrate 210, respectively.

Among these stacked bodies 263a to 263j, on the side surfaces of the stacked bodies 263c and 263h as the first structure located on one side of the diffusion region 214 in the X direction on the diffusion region 214 side, the sidewall 282 as the first sidewall is provided by the liner layer 281 covering the stacked bodies. Further, on the side surfaces of the stacked bodies 263b and 263i as the second structure located on the other side of the diffusion region 214 in the X direction on the diffusion region 214 side, the sidewall 283 as the second sidewall is provided by the liner layer 281 covering the stacked bodies.

The contact CG penetrates the interlayer insulating layer 290, the liner layer 281, and the cap layer 241 and is connected to the metal electrode 232 of the gate electrode 230a. The contact CS penetrates the interlayer insulating layer 290 and the liner layer 281 and is connected to the silicide layers 215 on both sides of the gate electrode 230a in the X direction.

The semiconductor device 201 of the first modification can be manufactured by the same method as the method for manufacturing the semiconductor device 200 of the second embodiment described above, except for the process related to the formation of the gate electrode 230a.

That is, in the manufacturing process of the semiconductor device 201, in addition to the polysilicon electrode 231 shown in FIG. 14A, a metal electrode 232 is formed on the polysilicon electrode 231, and a cap layer 241 is formed on the metal electrode 232.

At this time, similarly, the metal layer 252 is formed on the polysilicon layer 251, and the cap layer 241 is formed on the metal layer 252.

Further, by performing the subsequent processes in the same manner as in the case of the second embodiment described above, the semiconductor device 201 of the first modification is manufactured.

According to the semiconductor device 201 of the first modification, the same effect as that of the semiconductor device 200 of the second embodiment described above is obtained.

Second Modification

In the above-described second embodiment, the dummy electrode 250 extends in the Y direction, similar to the gate electrode 230 of the transistor TR, for example. However, the stretching direction of the dummy electrode may be different from that of the gate electrode 230. Hereinafter, an example of a semiconductor device 202 having a dummy electrode 250b extending in a direction different from that of the gate electrode 230 will be described with reference to FIGS. 19A and 19B.

Figure 19A:
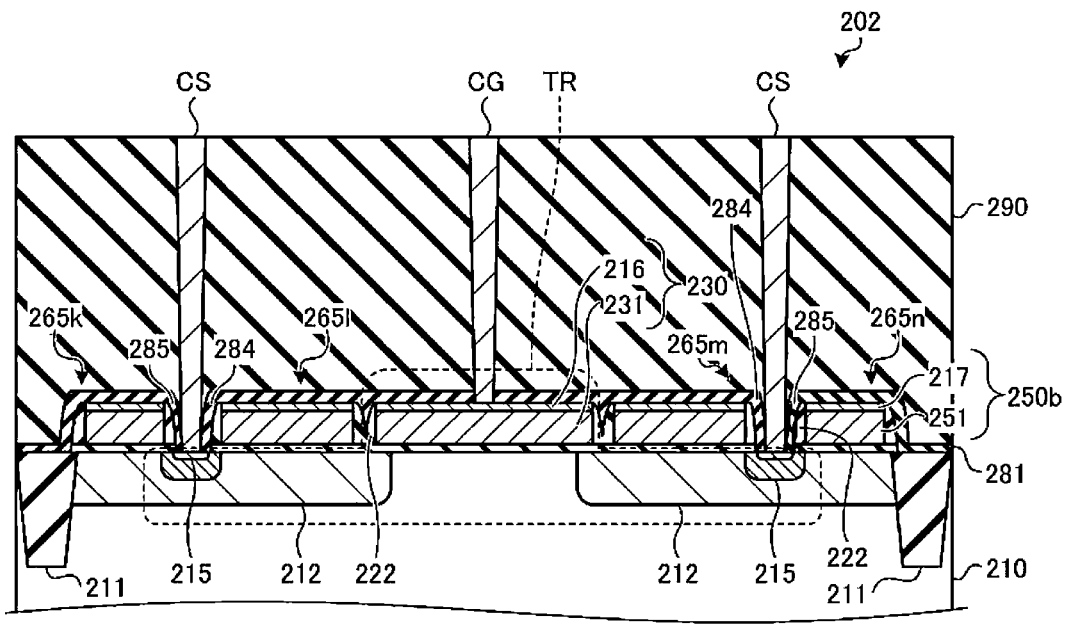
FIGS. 19A and 19B are diagrams showing an example of a configuration of a semiconductor device according to a second modification of the second embodiment.
Figure 19B:
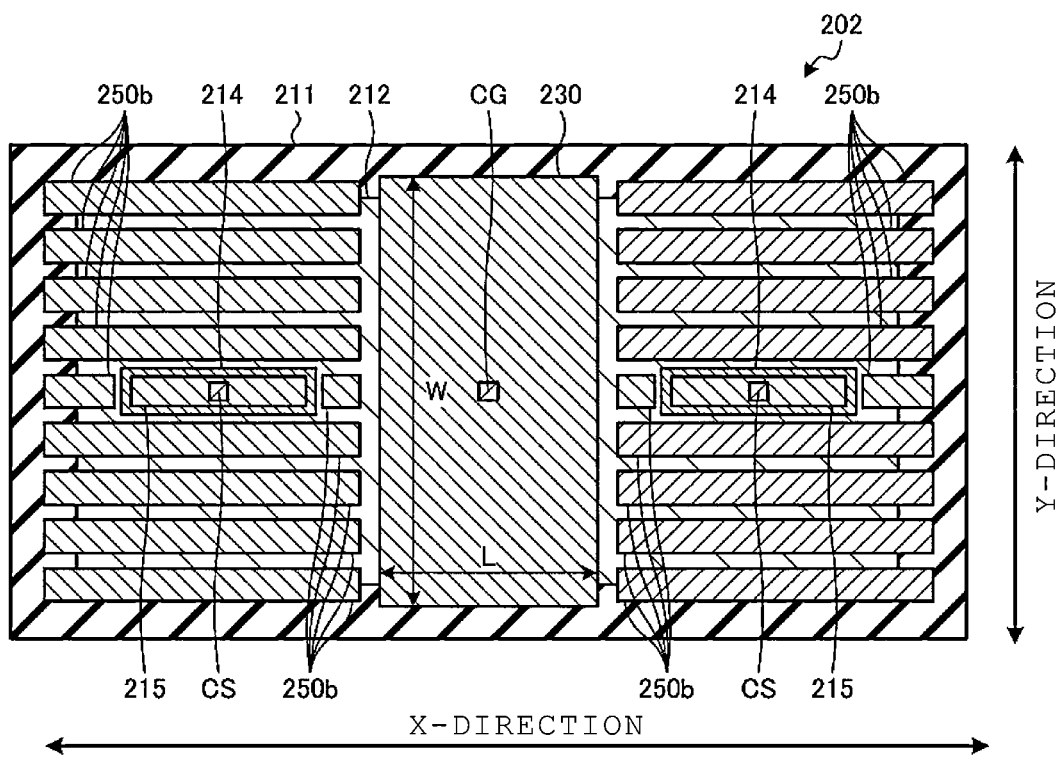

FIGS. 19A and 19B are diagrams showing an example of a configuration of a semiconductor device 202 according to a second modification of the second embodiment.

FIG. 19A is a cross-sectional view of the semiconductor device 202 along the X direction and corresponds to FIG. 13A of the above-described second embodiment. FIG. 19B is a schematic top view showing the layout of the semiconductor device 202 and corresponds to FIG. 13B of the above-described second embodiment. In FIG. 19B, the element isolation layer 211, the diffusion regions 212 and 214, the silicide layer 215, the gate electrode 230, and the dummy electrode 250b are mainly shown, and other configurations are omitted.

Further, in the semiconductor device 202 of the second modification, the same reference numerals are given to the same configurations as those of the second embodiment and the descriptions thereof will be omitted. Further, in the semiconductor device 202 of the second modification, the direction along the X direction may be referred to as the second direction, and the direction along the Y direction may be referred to as a first direction.

As shown in FIGS. 19A and 19B, a transistor TR is provided in the region separated by the element isolation layer 211. The transistor TR has a gate electrode 230 extending in a direction along the Y direction and has the same configuration as that of the first embodiment described above.

On both sides of the gate electrode 230 in the X direction, a plurality of dummy electrodes 250b that are separated from each other in the Y direction and extend in the direction along the X direction are provided. Similar to the gate electrode 230, the dummy electrode 250b has a layered structure of the polysilicon layer 251 and the SALICIDE layer 217 on the polysilicon layer 251 and is a dummy structure having no effective function.

The gate electrode 230 and the dummy electrode 250b share a gate insulating layer 221 that continuously extends the lower layer of the gate electrode 230 and the dummy electrode 250b.

The spacer layer 222 is formed on the side surfaces of the gate electrode 230 and the dummy electrode 250b. These spacer layers 222 are connected to the spacer layer 222 of the gate electrode 230 adjacent in the X direction or the dummy electrode 250b adjacent in the Y direction.

Further, the gate electrode 230 and the dummy electrode 250b are covered with the liner layer 281 directly on the upper surface thereof and via the spacer layer 222 on the side surface.

As a result, the stacked body 265 including the gate insulating layer 221, the dummy electrode 250b, the spacer layer 222, and the liner layer 281 are located on the substrate 210, respectively.

Among these stacked bodies 265, sidewalls 284 are provided on the side surfaces of the stacked bodies 265l and 265m located on one side of the diffusion region 214 in the X direction on the diffusion region 214 side by a liner layer 281 covering the stacked bodies. Further, a sidewall 285 is provided on the side surface of the stacked bodies 265k and 265n located on the other side of the diffusion region 214 in the X direction on the diffusion region 214 side by a liner layer 281 covering the stacked bodies.

Similarly, on the side surface of the stacked body 265 as the first structure located on one side of the diffusion region 214 in the Y direction on the diffusion region 214 side, a sidewall as a first sidewall is provided by a liner layer 281 covering the stacked body. Further, on the side surface of the stacked body 265 as the second structure located on the other side of the diffusion region 214 in the Y direction on the diffusion region 214 side, a sidewall as a second sidewall is provided by a liner layer 281 covering the stacked body.

The contact CG penetrates the interlayer insulating layer 290 and the liner layer 281 and is connected to the SALICIDE layer 216 of the gate electrode 230. The contact CS penetrates the interlayer insulating layer 290 and the liner layer 281 and is connected to the silicide layers 215 on both sides of the gate electrode 230 in the X direction. At this time, the contact CS passes between the sidewalls of the stacked body 261 to be connected to the silicide layer 215 on the diffusion region 214 while contacting the sidewall at least on one side of the stacked body 261 provided on both sides of the diffusion region 214 in the Y direction.

According to the semiconductor device 202 of the second modification, the dummy electrodes 250b extend in the X direction at positions separated from each other in the Y direction. In this way, the stretching direction of the dummy electrode 250b can be made different from the stretching direction of the gate electrode 230, which can increase the degree of freedom in the layout of the semiconductor device 202 and reduce the design load.

According to the semiconductor device 202 of the second modification, the same effect as that of the semiconductor device 200 of the second embodiment described above is obtained.

The dummy electrode can take any stretching direction such as a direction obliquely intersecting with the gate electrode 230, in addition to the direction along the X direction and the direction along the Y direction as described above.

Application Example of Semiconductor Device

The configurations of the above-described first and second embodiments and the modifications thereof can be applied to, for example, a transistor provided around a memory cell of a semiconductor memory device and configuring a drive circuit for operating the memory cell. Hereinafter, a configuration example of a semiconductor memory device including a transistor to which any of the configurations of the above-described first and second embodiments and the modifications thereof is applied will be described with reference to the drawings.

(Rough Configuration of Semiconductor Memory Device)

Figure 20:
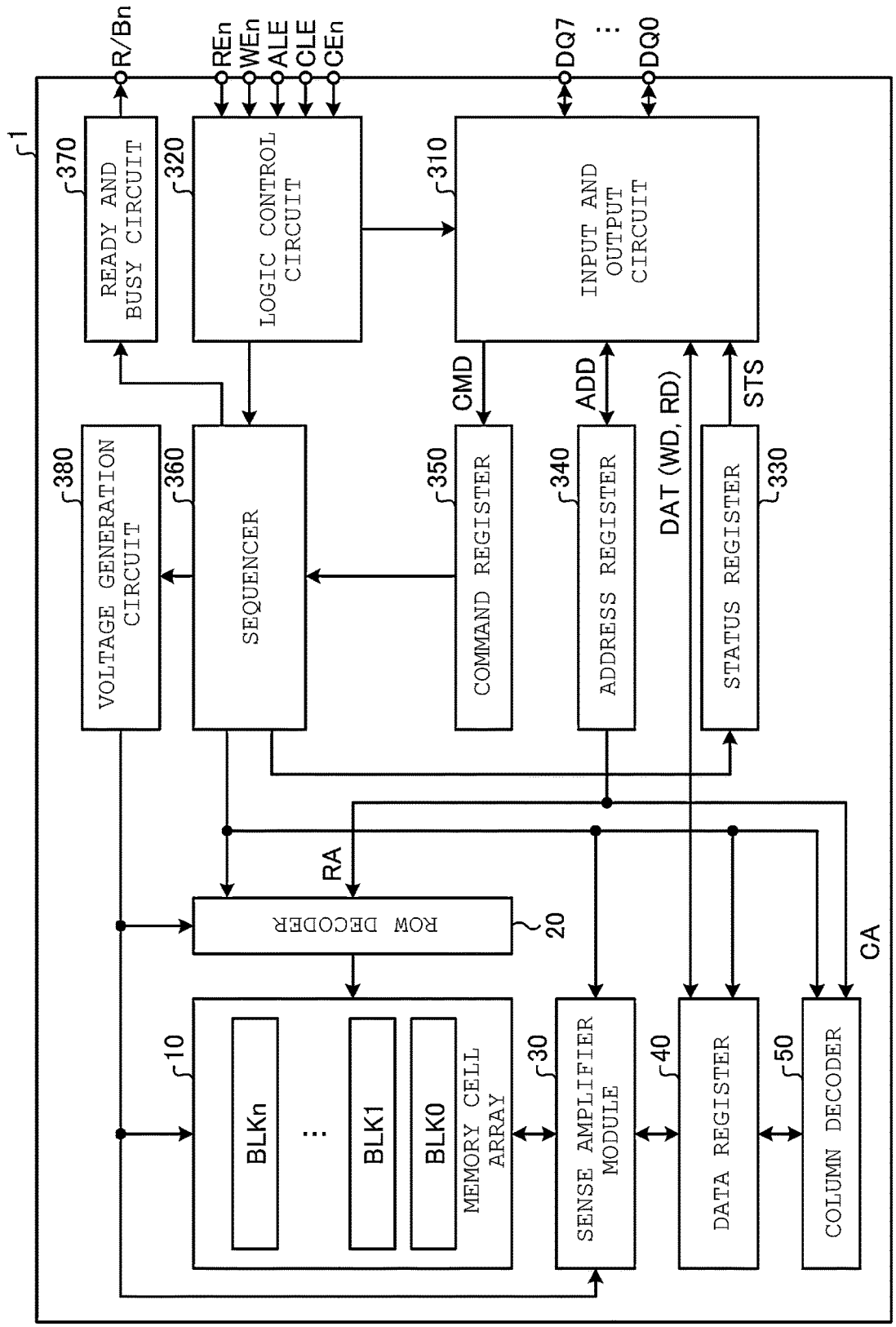
FIG. 20 is a block diagram of a semiconductor memory device according to another embodiment.

FIG. 20 is a block diagram of a semiconductor memory device 1 according to another embodiment. As shown in FIG. 20, the semiconductor memory device 1 includes an input and output circuit 310, a logic control circuit 320, a status register 330, an address register 340, a command register 350, a sequencer 360, a ready and busy circuit 370, a voltage generation circuit 380, a memory cell array 10, a row decoder 20, a sense amplifier module 30, a data register 40, and a column decoder 50.

The input and output circuit 310 controls the input and output of the signal DQ with an external device such as a memory controller (not shown) that controls the semiconductor memory device 1. The input and output circuit 310 includes an input circuit and an output circuit (not shown).

The input circuit transmits the data DAT such as the write data WD received from the external device to the data register 40, the address ADD to the address register 340, and the command CMD to the command register 350.

The output circuit transmits the status information STS received from the status register 330, the data DAT such as the read data RD received from the data register 40, and the address ADD received from the address register 340 to an external device.

The logic control circuit 320 receives, for example, a chip enable signal CEn, a command latch enable signal CLE, an address latch enable signal ALE, a write enable signal WEn, and a read enable signal REn from an external device. Further, the logic control circuit 320 controls the input and output circuit 310 and the sequencer 360 according to the received signal.

The status register 330 temporarily stores the status information STS in, for example, a write operation, a read operation, and an erasing operation of the data, and notifies the external device whether the operation is normally completed.

The address register 340 temporarily stores the address ADD received from the external device via the input and output circuit 310. Further, the address register 340 transfers the row address RA to the row decoder 20 and the column address CA to the column decoder 50.

The command register 350 temporarily stores the command CMD received from the external device via the input and output circuit 310 and transfers the command CMD to the sequencer 360.

The sequencer 360 controls the operation of the entire semiconductor memory device 1. More specifically, the sequencer 360 controls, for example, the status register 330, the ready and busy circuit 370, the voltage generation circuit 380, the row decoder 20, the sense amplifier module 30, the data register 40, and the column decoder 50 and the like depending on the command CMD stored by the command register 350 to execute the write operation, the read operation, the erasing operation, and the like.

The ready and busy circuit 370 transmits a ready and busy signal R/Bn to an external device according to the operating status of the sequencer 360.

The voltage generation circuit 380 generates the voltage required for the write operation, the read operation, and the erasing operation according to the control of the sequencer 360 and supplies the generated voltage to, for example, the memory cell array 10, the row decoder 20, the sense amplifier module 30, and the like. The row decoder 20 and the sense amplifier module 30 apply the voltage supplied from the voltage generation circuit 380 to the memory cells in the memory cell array 10.

The memory cell array 10 includes a plurality of blocks BLK (BLK0 to BLKn). n is an integer of 2 or more. A block BLK is a set of a plurality of memory cells associated with a bit line and a word line, and is, for example, a data erasing unit. The memory cell is configured as, for example, a transistor and stores non-volatile data.

By providing such a memory cell, the semiconductor memory device 1 is configured as, for example, a NAND type non-volatile memory. However, the semiconductor memory device 1 may be configured as another non-volatile memory such as a NOR type.

The row decoder 20 decodes the row address RA. Further, the row decoder 20 selects one of the blocks BLK based on the decoded result. Further, the row decoder 20 applies a required voltage to the block BLK.

The sense amplifier module 30 senses the data read from the memory cell array 10 during the read operation. Further, the sense amplifier module 30 transmits the read data RD to the data register 40. During the write operation, the sense amplifier module 30 transmits the write data WD to the memory cell array 10.

The data register 40 includes a plurality of latch circuits. The latch circuit stores the write data WD and the read data RRD. For example, in the write operation, the data register 40 temporarily stores the write data WD received from the input and output circuit 310 and transmits the write data to the sense amplifier module 30. Further, for example, in the read operation, the data register 40 temporarily stores the read data RD received from the sense amplifier module 30 and transmits the read data to the input and output circuit 310.

The column decoder 50 decodes the column address CA during, for example, the write operation, the read operation, and the erasing operation and selects a latch circuit in the data register 40 according to the decoded result.

Each of the above configurations of the semiconductor memory device 1 except for the memory cell array 10 is also referred to as a peripheral circuit. The peripheral circuit is a group of circuits located around the memory cell array 10 and includes the input and output circuit 310, a logic control circuit 320, the status register 330, the address register 340, the command register 350, the sequencer 360, the ready and busy circuit 370, the voltage generation circuit 380, the row decoder 20, the sense amplifier module 30, the data register 40, and the column decoder 50.

As described above, the semiconductor memory device 1 includes a memory cell array 10 including a plurality of memory cells, and a peripheral circuit for operating the plurality of memory cells.

(Circuit Configuration of Memory Cell Array and Row Decoder)

Figure 21:
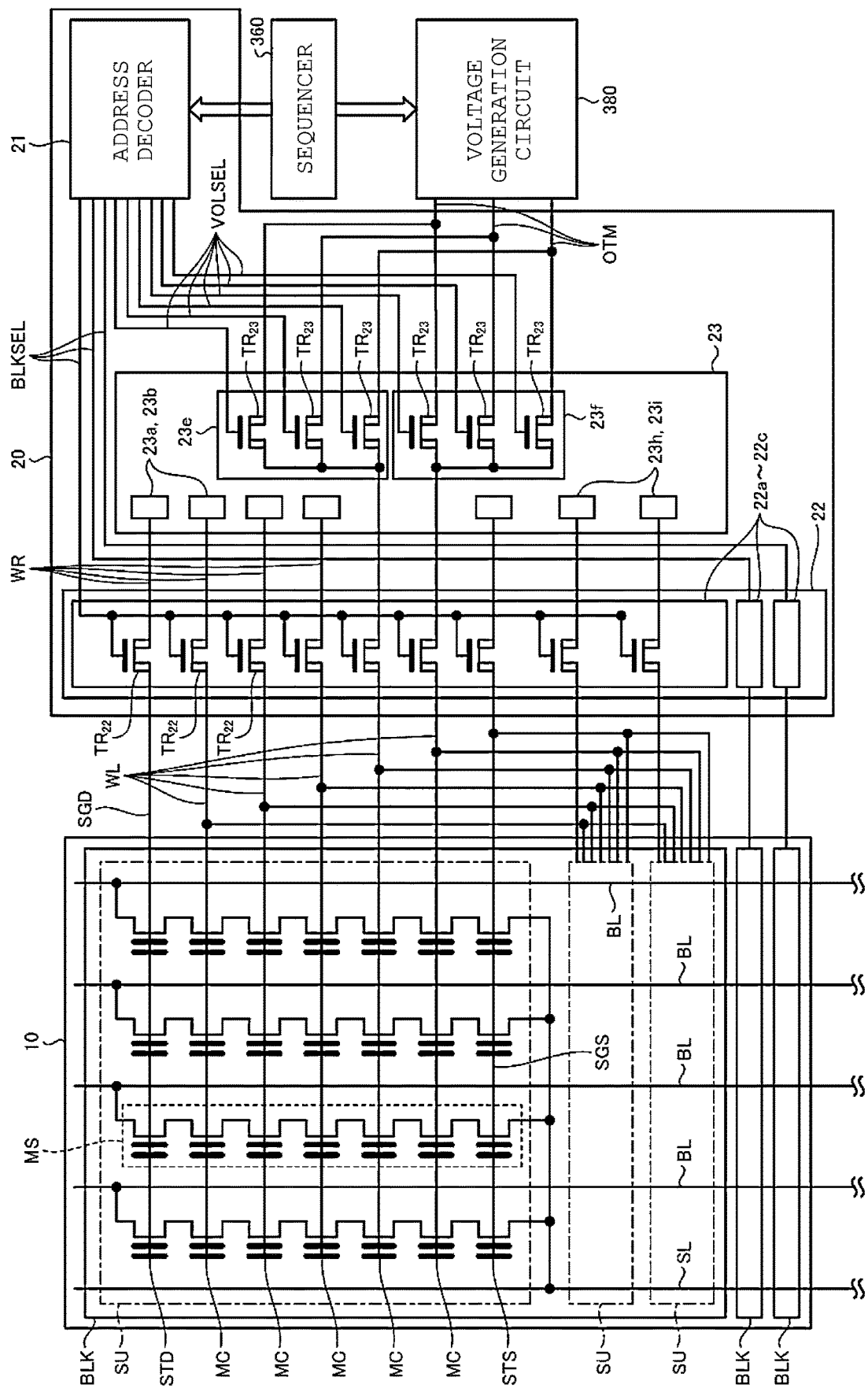
FIG. 21 is an equivalent circuit diagram showing an example of a configuration of a memory cell array and a row decoder provided in the semiconductor memory device according to the other embodiment.

FIG. 21 is an equivalent circuit diagram showing an example of the configuration of the memory cell array 10 and the row decoder 20 provided in the semiconductor memory device 1 according to the other embodiment. First, an example of the circuit configuration of the memory cell array 10 provided in the semiconductor memory device 1 will be described below.

The memory cell array 10 includes a plurality of blocks BLK as described above. Each of the plurality of blocks BLK includes a plurality of string units SU. Each of the plurality of string units SU includes a plurality of memory strings MS. One end of each of the plurality of memory strings MS is connected to peripheral circuits such as the row decoder 20 and the sense amplifier module 30 via the bit line BL. The other end of each of the plurality of memory strings MS is connected to peripheral circuits via a common source line SL.

The memory string MS includes a drain select transistor STD connected in series between the bit line BL and the source line SL, a plurality of memory cells MC, and a source select transistor STS. Hereinafter, the drain select transistor STD and the source select transistor STS may be simply referred to as the select transistor (STD and STS).

The memory cell MC is, for example, a field effect transistor (FET) including a charge storage layer in a gate insulating layer. The threshold voltage of the memory cell MC changes according to the amount of charge in the charge storage layer. By providing one or a plurality of threshold voltages, the memory cell MC may be able to store one bit or a plurality of bits of data. A word line WL is connected to each of the gate electrodes of the plurality of memory cells MC corresponding to one memory string MS. Each of these word lines WL is commonly connected to all memory strings MS in one block BLK.

The select transistors (STD and STS) are, for example, field effect transistors. Selected gate lines (SGD and SGS) are connected to the gate electrodes of the select transistors (STD and STS), respectively. The drain selected line SGD connected to the drain select transistor STD is provided corresponding to the string unit SU and is commonly connected to all the memory strings MS in one string unit SU. The source selected line SGS connected to the source select transistor STS is commonly connected to all memory strings MS in one block BLK.

Next, the circuit configuration of the row decoder 20 provided in the semiconductor memory device 1 will be described.

The row decoder 20 includes an address decoder 21, a block selection circuit 22, and a voltage selection circuit 23. The row decoder 20 includes transistors TR22 and TR23, and the like to which, for example, any configuration of the above-described first and second embodiments and modifications thereof are applied in these circuits.

The address decoder 21 includes a plurality of block selected lines BLKSEL and a plurality of voltage selected lines VOLSEL.

The address decoder 21 refers to the address data of the address register 340 (see FIG. 20) in the above-mentioned peripheral circuit according to the control signal from the sequencer 360, for example.

Further, the address decoder 21 decodes the referenced address data, turns on the transistors TR22 and TR23 corresponding to the address data, and turns off the rest of the transistors TR22 and TR23. The transistor TR22 and the transistor TR23 are transistors in the block selection circuit 22 and the voltage selection circuit 23, which will be described later, respectively.

Further, the address decoder 21 sets the voltage of the block selected line BLKSEL and the voltage selected line VOLSEL corresponding to the address data to, for example, the "H" state, and sets the rest of the voltages to the "L" state. The voltage applied to these wirings is reversed depending on whether the block selection circuit 22 and the voltage selection circuit 23 use N-channel type or P-channel type transistors. The above voltage is an example of when the transistor is an N-channel type.

In the example of FIG. 21, the address decoder 21 is provided with one block selected line BLKSEL for each block BLK in the memory cell array 10. However, this configuration can be changed as appropriate. For example, one block selected line BLKSEL may be provided for two or more blocks BLK.

The block selection circuit 22 includes a plurality of block selection units 22a to 22c corresponding to the block BLK of the memory cell array 10. Each of the plurality of block selection units 22a to 22c includes a plurality of transistors TR22 corresponding to the word line WL and the selected gate line (SGD or SGS).

The transistor TR22 is a high breakdown voltage N-channel MOS transistor and functions as a block drive transistor. Each of the drain electrodes of the transistor TR22 is electrically connected to the corresponding word line WL or selected gate line (SGD or SGS). Each of the source electrodes of the transistor TR22 is electrically connected to the voltage output terminal OTM via the wiring WR and the voltage selection circuit 23. The gate electrode of the transistor TR22 is commonly connected to the corresponding block selected line BLKSEL.

Moreover, the block selection circuit 22 further includes a plurality of transistors (not shown). The plurality of transistors are high breakdown voltage CMOS transistors connected between the selected gate line (SGD or SGS) and the ground voltage supply terminal. The plurality of transistors electrically connect the selected gate line (SGD or SGS) in the non-selected block BLK in the memory cell array 10 to the ground voltage supply terminal. The plurality of word lines WL in the non-selected block BLK are in a floating state.

The voltage selection circuit 23 includes a plurality of voltage selection units 23a to 23i corresponding to the word line WL and the selected gate line (SGD or SGS). Each of the plurality of voltage selection units 23a to 23i includes a plurality of transistors TR23.

The transistor TR23 is a high breakdown voltage N-channel MOS transistor and functions as a voltage select transistor. The drain terminals of the transistor TR23 are electrically connected to the corresponding word line WL or selected gate line (SGD or SGS) via the wiring WR and the block selection circuit 22, respectively. Each source terminal is electrically connected to the corresponding voltage output terminal OTM. Each gate electrode is connected to the corresponding voltage selected line VOLSEL.

As described above, the row decoder 20 belonging to the peripheral circuit includes a plurality of transistors TR22 and TR23, and the like. However, the circuit configuration of the row decoder 20 shown in FIG. 21 is an example, and the number and types of transistors TR22 and TR23, and the like in the row decoder 20 may vary.

APPENDIX

Hereinafter, preferable aspects of the present disclosure will be added.

Appendix 1

According to one aspect of the present disclosure,
a semiconductor device is provided which includes
a first region that contains a first conductive type impurity and is provided on a substrate,
a second region that is provided in the first region and contains the first conductive type impurity at a higher concentration than the first region,
a first structure that is provided on the substrate on one side of the second region in a first direction along the substrate and has a first sidewall at least on the second region side,
a second structure that is provided on the substrate on the other side of the second region in the first direction and has a second sidewall at least on the second region side, and
a contact that passes between the first and second sidewalls facing each other across the second region, extends to the second region, and is electrically connected to the second region.

Appendix 2

In the semiconductor device of Appendix 1,
the side surface of the contact is in contact with at least one of the first and second sidewalls at least on one side in the first direction.

Appendix 3

According to another aspect of the present disclosure,
a semiconductor device is provided which includes
a first region that contains a first conductive type impurity and is provided on a substrate,
a second region that is provided in the first region and contains the first conductive type impurity at a higher concentration than the first region,
a gate electrode that is provided at a position above the first region and not overlapping the second region,
first sidewalls that are provided on both sides of the gate electrode in a first direction along the substrate via an insulating layer,
the insulating layer that is provided on the substrate on the side opposite to the gate electrode in the first direction with respect to the second region,
second sidewalls that are provided on both sides of the insulating layer in the first direction, and
a first contact that passes between the first and second sidewalls facing each other across the second region, extends to the second region, and is electrically connected to the second region.

Appendix 4

In the semiconductor device of Appendix 3,
the center position between the insulating layers facing each other across the second region in the first direction and the center position of the second region in the first direction substantially coincide with each other.

Appendix 5

In the semiconductor device of Appendix 3,
a silicide layer is provided on the surface of the second region between the insulating layers facing each other across the second region in the first direction, and
the lower end portion of the first contact is connected to the silicide layer.

Appendix 6

In the semiconductor device of Appendix 5,
the center position of the second region and the center position of the silicide layer in the first direction substantially coincide with each other.

Appendix 7

In the semiconductor device of Appendix 5 or Appendix 6,
the first contact is a contact to which a high voltage is applied.

Appendix 8

In the semiconductor device of any of Appendix 3 to Appendix 7,
the insulating layer is also provided above the gate electrode.

Appendix 9

According to still another aspect of the present disclosure,
a semiconductor device is provided which includes
a first region that contains a first conductive type impurity and is provided on a substrate,
a second region that is provided in the first region and contains the first conductive type impurity at a higher concentration than the first region,
a gate electrode that is provided at a position above the first region and not overlapping the second region,
a first dummy electrode that is provided on the substrate on one side of the second region in a first direction along the substrate with a layered structure similar to that of the gate electrode and has no effective function,
a first sidewall that is provided on the side surface of the first dummy electrode on the second region side,
a second dummy electrode that is provided on the substrate on the other side of the second region in the first direction with a layered structure similar to that of the gate electrode and has no effective function,
a second sidewall that is provided on the side surface of the second dummy electrode on the second region side, and
a first contact that passes between the first and second sidewalls facing each other across the second region, extends to the second region, and is electrically connected to the second region.

Appendix 10

In the semiconductor device of Appendix 9,
the center position between the first and second dummy electrodes facing each other across the second region in the first direction, and the center position of the second region in the first direction substantially coincide with each other.

Appendix 11

In the semiconductor device of Appendix 9 or Appendix 10,
a silicide layer is provided on the surface of the second region between the first and second dummy electrodes, and
the lower end portion of the first contact is connected to the silicide layer.

Appendix 12

In the semiconductor device of Appendix 11,
the first contact is a contact to which a high voltage is applied.

Appendix 13

In the semiconductor device of any of Appendix 1 to Appendix 12,
a second contact is connected to the upper surface of the gate electrode.

Appendix 14

In the semiconductor device of any of Appendix 1 to Appendix 13,
the gate electrode includes
a polysilicon electrode, and
a metal electrode provided on the polysilicon electrode.

Appendix 15

In the semiconductor device of any of Appendix 1 to Appendix 13,
the gate electrode includes
a polysilicon electrode, and
a SALICIDE layer provided on the polysilicon electrode.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a first region containing a first conductive type impurity and disposed on the substrate;
    a second region disposed in the first region and containing the first conductive type impurity at a higher concentration than the first region;
    a first structure disposed on the substrate on one side of the second region in a first direction along the substrate, the first structure having a first sidewall at least on the second region side, the first structure including one or more gate electrodes;
    a second structure disposed on the substrate on an other side of the second region in the first direction, the second structure having a second sidewall at least on the second region side, the second structure including a block layer while having no gate electrode; and
    a contact passing between the first and second sidewalls facing each other across the second region, extending to the second region, and being electrically connected to the second region.

2. The semiconductor device according to claim 1, wherein
    the first structure includes:
        a first gate electrode and a second gate electrode disposed at a position above the first region without overlapping the second region, and
        spacer layers disposed on both sides of the first and second gate electrode electrodes in the first direction, respectively,
    and
    the second structure includes:
        an insulating layer at least disposed on both sides of the block layer.

3. A semiconductor device comprising:
    a first region containing a first conductive type impurity and being disposed on a substrate;
    a second region disposed in the first region and containing the first conductive type impurity at a higher concentration than the first region;
    a gate electrode disposed above the first region without overlapping the second region;
    a block layer disposed at least above the second region;
    an insulating layer disposed over the gate electrode and the block layer;
    first sidewalls disposed on both sides of the gate electrode in a first direction along the substrate via a first portion of the insulating layer;
    second sidewalls disposed on both sides of a second portion of the insulating layer in the first direction; and
    a first contact passing between one of the first sidewalls and one of the second sidewalls facing each other across the second region, extending to the second region, and being electrically connected to the second region.

4. The semiconductor device according to claim 3, wherein
    a silicide layer disposed on the surface of the second region between the insulating layer facing each other across the second region in the first direction, and
    wherein a lower end portion of the first contact is connected to the silicide layer.

5. The semiconductor device according to claim 1, wherein
    a side surface of the contact is in contact with at least one of the first or second sidewalls at least on one side in the first direction.

6. The semiconductor device according to claim 1, wherein
   a center position between the first and second sidewalls, and a center position of the second region in the first direction substantially coincide with each other.

7. The semiconductor device according to claim 4, wherein
   a center position of the second region and a center position of the silicide layer in the first direction substantially coincide with each other.

8. The semiconductor device according to claim 4, wherein
   the first contact is applied with a voltage.

9. The semiconductor device according to claim 3, further comprising
   a second contact connected to an upper surface of the gate electrode.

10. The semiconductor device according to claim 3, wherein
    the gate electrode includes:
    a polysilicon electrode, and
    a metal electrode provided on the polysilicon electrode.

11. The semiconductor device according to claim 3, wherein the gate electrode includes:
    a polysilicon electrode, and
    a salicide layer provided on the polysilicon electrode.

12. The semiconductor device according to claim 1, further comprising:
    a third structure disposed opposite the first structure from the second structure in the first direction, the third structure including one or more gate electrodes; and
    another contact interposed between the first structure and the third structure in the first direction.

13. The semiconductor device according to claim 1, further comprising:
    a gate electrode disposed at a position above the first region without overlapping the second region, wherein
    the first structure includes:
    a first dummy electrode having a layered structure having the same layered materials as that of the gate electrode and having no effective function, and
    the first sidewall is disposed on the side surface of the first dummy electrode on the second region side, and
    the second structure includes:
    a second dummy electrode having a layered structure having the same layered materials as that of the gate electrode and having no effective function, and
    the second sidewall is disposed on the side surface of the second dummy electrode on the second region side.

* * * * *